United States Patent
Komaili et al.

(10) Patent No.: US 8,948,322 B2
(45) Date of Patent: *Feb. 3, 2015

(54) CIRCUITS, SYSTEMS, AND METHODS FOR MANAGING AUTOMATIC GAIN CONTROL IN QUADRATURE SIGNAL PATHS OF A RECEIVER

(71) Applicant: Skyworks Solutions, Inc., Woburn, MA (US)

(72) Inventors: Jaleh Komaili, Irvine, CA (US); John E. Vasa, Irvine, CA (US); Thomas Obkircher, Tustin, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/027,540

(22) Filed: Sep. 16, 2013

(65) Prior Publication Data

US 2014/0086370 A1    Mar. 27, 2014

Related U.S. Application Data

(63) Continuation of application No. 13/361,247, filed on Jan. 30, 2012, now Pat. No. 8,565,358, which is a continuation of application No. 12/349,787, filed on Jan. 7, 2009, now Pat. No. 8,126,094.

(51) Int. Cl.
*H04L 27/08* (2006.01)
*H04L 27/38* (2006.01)

(52) U.S. Cl.
CPC .................................. *H04L 27/3809* (2013.01)
USPC ..................... 375/345; 455/234.1; 455/234.2; 455/239.1; 455/240.1; 455/241.1; 455/245.1; 455/245.2; 455/246.1; 455/247.1; 455/250.1; 455/251.1

(58) Field of Classification Search
CPC .. H04L 27/3809; H04L 27/08; H03G 3/3068; H03G 3/3078; H03G 3/20; H03G 2201/103; H03G 2201/202; H03G 2201/206; H03G 2201/302; H03G 2201/307

USPC ................. 375/345; 455/234.1, 234.2, 239.1, 455/240.1, 241.1, 242.2, 245.1, 245.2, 455/246.1, 247.1, 250.1, 251.1

See application file for complete search history.

(56) References Cited

U.S. PATENT DOCUMENTS 5,107,225 A    4/1992 Wheatley, III et al.
5,677,962 A *  10/1997 Harrison et al. .............. 381/109

(Continued)

FOREIGN PATENT DOCUMENTS

CN    1650517    8/2005
CN    1843010    10/2006

(Continued)

OTHER PUBLICATIONS

International Search Report in International Application No. PCT/US2010/020197 dated Jul. 23, 2010, 3 pgs.

(Continued)

*Primary Examiner* — Sophia Vlahos
(74) *Attorney, Agent, or Firm* — Knobbe, Martens, Olson & Bear, LLP

(57) ABSTRACT

A system provides closed-loop gain control in a WCDMA mode and open loop control in an EDGE/GSM mode. Gain control is distributed across analog devices and a digital scaler in a wireless receiver. In the WCDMA mode, a loop filter generates an error signal that is forwarded to analog and digital control paths. The analog control path includes a first adder, a programmable hysteresis element, and a lookup table. The analog control signal is responsive to thresholds, which when used in conjunction with a previous gain value determine a new gain value. The digital control path includes a second adder, a programmable delay element, and a converter. A control word is responsive to a difference of the error signal, a calibration value, and the analog control signal. Blocker detection is provided in the WCDMA mode of operation. A controller sets system parameters using a state machine.

20 Claims, 11 Drawing Sheets

(56) References Cited

U.S. PATENT DOCUMENTS

| | | | |
|---|---|---|---|
| 6,141,561 A | 10/2000 | Izumiyama | |
| 6,160,443 A | 12/2000 | Maalej et al. | |
| 6,441,664 B2 | 8/2002 | Tsuiki et al. | |
| 6,670,901 B2 | 12/2003 | Brueske et al. | |
| 6,731,703 B2 | 5/2004 | Kurihara | |
| 6,950,641 B2 | 9/2005 | Gu | |
| 7,016,435 B2 | 3/2006 | Adachi | |
| 7,212,798 B1 | 5/2007 | Adams et al. | |
| 7,486,941 B2* | 2/2009 | Rahman et al. | 455/234.1 |
| 7,489,740 B2* | 2/2009 | Yen et al. | 375/317 |
| 7,653,368 B2 | 1/2010 | Ashkenazi | |
| 7,660,569 B2 | 2/2010 | Xiong | |
| 7,684,772 B2* | 3/2010 | Lee et al. | 455/127.3 |
| 7,702,046 B2 | 4/2010 | Murthy et al. | |
| 7,982,651 B1 | 7/2011 | Zortea | |
| 8,126,094 B2 | 2/2012 | Komaili et al. | |
| 8,401,128 B2 | 3/2013 | Lindoff et al. | |
| 8,565,358 B2 | 10/2013 | Komaili et al. | |
| 8,605,836 B2* | 12/2013 | Murthy et al. | 375/345 |
| 2001/0003536 A1 | 6/2001 | Kurihara | |
| 2002/0163979 A1 | 11/2002 | Takatz et al. | |
| 2005/0047534 A1 | 3/2005 | Lindoff et al. | |
| 2005/0239427 A1 | 10/2005 | Inoue et al. | |
| 2005/0276358 A1* | 12/2005 | Pipilos | 375/345 |
| 2006/0222118 A1 | 10/2006 | Murthy et al. | |
| 2007/0081615 A1 | 4/2007 | Khoini-Poorfard et al. | |
| 2007/0188361 A1 | 8/2007 | Delanghe et al. | |
| 2007/0232219 A1 | 10/2007 | Xiong | |
| 2007/0291880 A1 | 12/2007 | Ashkenazi | |
| 2007/0293177 A1 | 12/2007 | Li | |
| 2008/0014895 A1 | 1/2008 | Li et al. | |
| 2008/0139110 A1 | 6/2008 | Lai et al. | |
| 2008/0310570 A1* | 12/2008 | Tomita | 375/357 |
| 2010/0046678 A1 | 2/2010 | Shukla et al. | |
| 2010/0141953 A1 | 6/2010 | Tazartes et al. | |

FOREIGN PATENT DOCUMENTS

| | | |
|---|---|---|
| JP | 2002-290278 | 10/2002 |
| TW | 281795 | 5/2007 |
| TW | 282669 | 6/2007 |
| TW | 285033 | 8/2007 |
| TW | 287366 | 9/2007 |
| WO | WO 2010/080788 | 7/2010 |

OTHER PUBLICATIONS

International Preliminary Report in International Application No. PCT/US2010/020197 dated Jul. 12, 2011, 6 pgs.

International Search Report and Written Opinion in International Application No. PCT/US2010/020197 dated Jul. 23, 2010, 5 pgs.

Khalid H. Abed, "CMOS VLSI Implementation of a Low Power Logarithmic Converter," IEEE Transaction on Computers, Nov. 2003. pp. 1421-1433.

Office Action in corresponding Taiwanese Application No. 099100199, received Dec. 3, 2014.

\* cited by examiner

CIRCUITS, SYSTEMS, AND METHODS FOR MANAGING AUTOMATIC GAIN CONTROL IN QUADRATURE SIGNAL PATHS OF A RECEIVER

CROSS-REFERENCED APPLICATION

This application is a continuation of and claims priority to U.S. patent application Ser. No. 13/361,247, filed Jan. 30, 2012, and titled "CIRCUITS, SYSTEMS, AND METHODS FOR MANAGING AUTOMATIC GAIN CONTROL IN QUADRATURE SIGNAL PATHS OF A RECEIVER," which is a continuation of U.S. patent application Ser. No. 12/349,787, filed Jan. 7, 2009, and titled "CIRCUITS, SYSTEMS, AND METHODS FOR MANAGING AUTOMATIC GAIN CONTROL IN QUADRATURE SIGNAL PATHS OF A RECEIVER," the disclosures of which are hereby incorporated by reference in their entirety.

BACKGROUND

Radio-frequency (RF) transceivers are found in many one-way and two-way communication devices, such as portable-communication devices, (cellular telephones), personal-digital assistants (PDAs) and other communication devices. A RF transceiver transmits and receives signals using whatever communication methodology is dictated by the particular communication system within which it is operating. For example, communication methodologies typically include amplitude modulation, frequency modulation, phase modulation, or a combination of these. In a typical global-system for mobile communications (GSM) mobile-communication system using narrowband time-division multiple access (TDMA), a Gaussian minimum shift keying (GMSK) modulation scheme is used to communicate data.

The deployment of new wireless systems presents unique challenges to mobile handset designers. In order to reap the full benefit of expanded capacity and increased data bandwidth, it is desirable for the next generation of handsets to work using multiple communication systems.

WCDMA (Wideband Code Division Multiple Access) is a radio access scheme used for third generation (3G) cellular systems that are being deployed world wide. The 3G systems support high-speed Internet access, video and high-quality image transmission services. In WCDMA systems, the CDMA air interface is combined with GSM based networks including enhanced data rates for GSM evolution (EDGE) networks. The EDGE standard is an extension of the GSM standard.

Conventional WCDMA and GSM/EDGE receiver architectures use a pair of circuits driven by mixers to separate components of the receive signal. Generally, sine and cosine components of the received carrier signal are applied to mixers to extract the separate components. This "mixing" of the carrier signal produces what is referred to as in-phase or "I" signal component and a quadrature phase or "Q" signal component. These I and Q signal components are filtered, gain/phase adjusted, and finally sent to a baseband digital signal processor to extract the communicated data.

In cellular communications systems, a signal transmitted from a base station is generally constant and at a level that provides for a region of overlap with its nearest-neighbor base stations in the cellular network. Consequently, a mobile transceiver that is relatively close to a base station receives a receive channel signal with a higher signal strength than a mobile transceiver that is positioned further from the base station. Accordingly, the receiver, for such a mobile transceiver, needs a large dynamic range to ensure that the mobile transceiver can process the full range of power levels across receive signals without creating distortion. This is typically accomplished using some manner of receive signal gain adjustment.

Prior art approaches to adjust gain include automatic gain control (AGC) systems implemented in the baseband portion of a transceiver. These prior art baseband approaches do not account for the intermittent presence of an interfering signal or blocker in the RF portion of the transceiver. For example, in digital-video broadcasting-handheld systems (DVB-H), a desired receive signal may be suddenly adversely affected or "jammed" with a GSM transmitter blocker that compresses the circuitry in the front end of the receiver. Furthermore, these prior art systems must constantly monitor and correct for changing signal conditions due to relative movement between the mobile transceiver and the nearest base station and relative movement of other objects in the path between the mobile transceiver and the nearest base station. These digital gain control systems often fail to provide accurate power control in environments where signal strength is rapidly varying over a large dynamic range.

SUMMARY

Circuits, systems and methods for managing AGC in the quadrature paths of a RF subsystem of a wireless-communication system are invented and disclosed.

An embodiment of method for managing AGC in the quadrature signal paths of a RF subsystem of a wireless communication system includes the steps of determining a first signal strength at an input to a channel select filter and a second signal strength at an output of the channel select filter, comparing the first and second signal strengths to detect when a blocker is present in the quadrature signal paths of the receiver and when the blocker is present, forwarding a blocker presence signal to an analog control branch of an AGC circuit, generating an analog control signal in the analog control branch of the AGC circuit in response to the blocker presence signal, the analog control signal configured to adjust at least one controllable gain element in an analog receiver path to prevent saturation of an analog-to-digital converter in a digital receiver path coupled to the analog receiver path in response to presence of the blocker, determining a difference between the second signal strength at the output of the channel select filter and a reference signal power and applying the difference between the second signal strength and the reference signal power to the AGC circuit, the AGC circuit having a loop filter coupled to the analog control branch and a digital control branch, the digital control branch generating a digital control word configured to adjust a scaler coupled to the output of the channel select filter.

An embodiment of a system for AGC in a RF subsystem of a wireless communication system includes a power estimator, a blocker identification element, a converter and an AGC circuit. The power estimator receives a first input from a digital receiver path and a second input from a channel select filter. The power estimator generates a first estimate of the signal power present at an output of the digital receiver path and a second estimate of the signal power present at the output of the channel select filter. The blocker identification element receives the first estimate and the second estimate from the power estimator and generates a blocker presence signal when a function of the first estimate and the second estimate exceeds a threshold value. The converter is coupled to an output of the power estimator and generates a logarithmic representation of the power in the digital receiver path. The AGC circuit receives the blocker presence signal and a difference of a reference signal and the logarithmic representation of the receive signal power in the digital receiver path. The AGC circuit includes a loop filter, an analog control branch, and a digital control branch. The analog control branch generates a control signal that is coupled to one or more elements in an analog receiver path. The digital control branch generates a control word that is applied to a scaler. The control signal and the control word distribute gain across analog and digital elements in the quadrature signal paths of the radio-frequency subsystem.

An embodiment of a circuit for AGC in a RF subsystem of a wireless communication system includes a receiver with an analog receiver path coupled to a digital receiver path, an output of the digital receiver path coupled to a scaler and an AGC circuit. The AGC circuit includes an analog control branch and a digital control branch. The analog control branch includes a first feedback adder and a lookup table. The analog control branch is responsive to a gain value received from a baseband element and a first calibration value. The analog control branch generates an analog control signal configured to adjust at least one controllable element in the analog receiver path. The digital control branch includes a second feedback adder, a programmable delay element, and a converter element. The digital control branch generates a control word responsive to the gain value received from the baseband element, a second calibration value, and a delayed representation of the analog control signal.

The figures and detailed description that follow are not exhaustive. The disclosed embodiments are illustrated and described to enable one of ordinary skill to make and use the circuits, systems, and methods for managing AGC in the quadrature signal paths of a receiver. Other embodiments, features and advantages of the circuits and methods will be or will become apparent to those skilled in the art upon examination of the following figures and detailed description. All such additional embodiments, features and advantages are within the scope of the disclosed circuits, systems, and methods as defined in the accompanying claims.

BRIEF DESCRIPTION OF THE FIGURES

The systems, circuits, and methods for managing AGC in the quadrature paths of a RF subsystem of a wireless communication system can be better understood with reference to the following figures. The components within the figures are not necessarily to scale, emphasis instead being placed upon clearly illustrating the principles and operation of the circuits, systems, and methods. Moreover, in the figures, like reference numerals designate corresponding parts throughout the different views.

DETAILED DESCRIPTION

Figure 1:
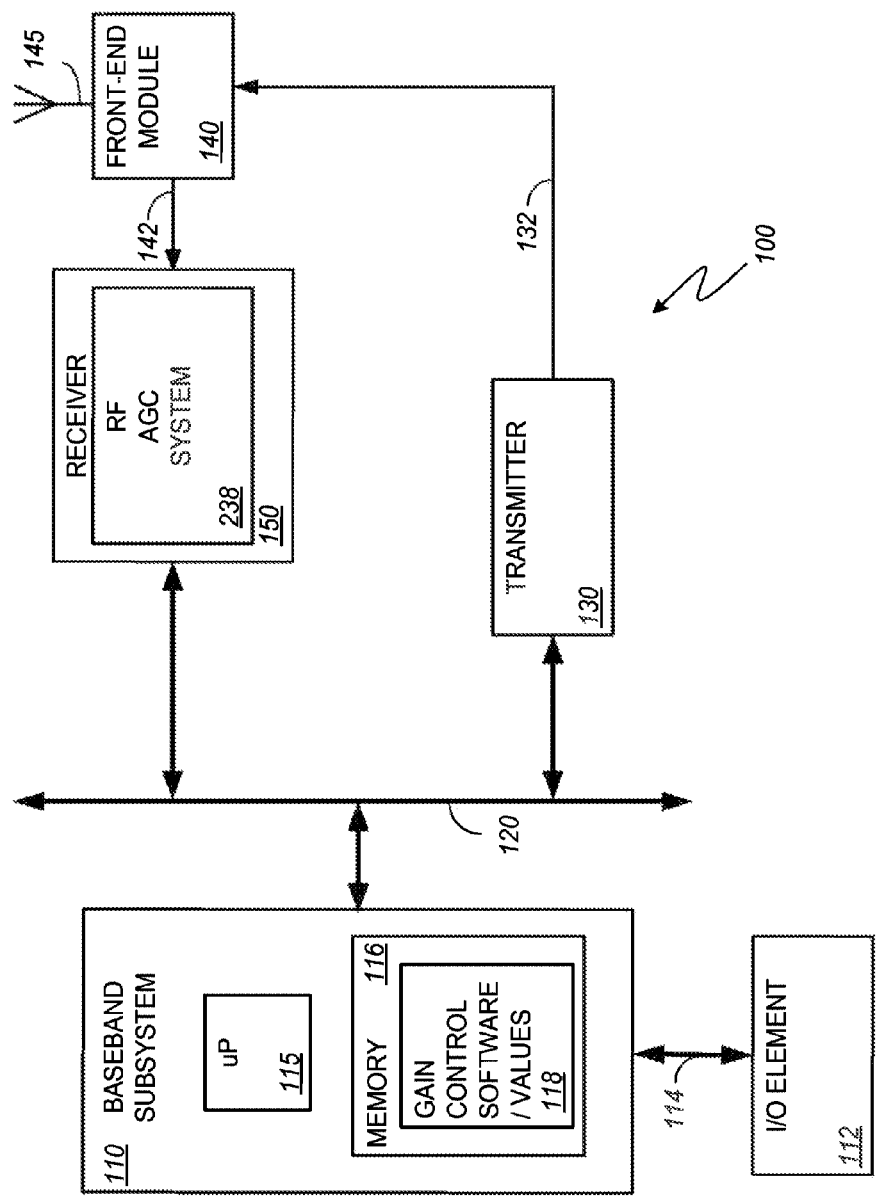
FIG. 1 is a block diagram illustrating a simplified-wireless system including a radio-frequency automatic gain control (RF AGC) system.

A system provides AGC in a RF portion of a wireless communication system. An embodiment of the RF AGC system includes a power estimator, a blocker identification element, a controller, and a AGC circuit. In this embodiment, the RF AGC system provides closed-loop control of one or more elements in an analog receiver path and closed-loop control of a scaler coupled between a digital receiver path and a baseband subsystem. Circuit elements in the RF AGC system operate on values using a logarithmic scale.

The power estimator receives a first input from the digital receiver path and a second input from the output of a channel select filter. The power estimator generates and forwards a first estimate responsive to the receive signal power from the digital receiver path and a second estimate responsive to the receive signal power at the output of the channel select filter. The power estimator forwards the first and second estimates to the blocker identification element. When the signal samples are processed at half the receiver sample rate, the same power estimator can be used to determine the signal power before and after the channel select filter.

The blocker identification element compares a function of the first and second estimates with a threshold value to determine when a blocker is present in the receiver. When a blocker is present, the AGC circuit forwards a control signal to adjust the gain in an analog receiver path to prevent saturation of an analog to digital converter in a digital receiver path coupled to the analog receiver path. The power estimator forwards an estimate of the signal power at the output of the channel select filter to an adder that combines a reference value with the signal power estimate. The output of the adder is forwarded to the AGC circuit.

In order to make the AGC operation transparent to a baseband subsystem, the controller manages states of the RF AGC system. At power-on, a number of "fast" AGC repetitions are performed to determine a signal power. The controller sets appropriate parameters in the AGC circuit. When the RF AGC system halts receiver operation for measurements, a second set of parameters for fast AGC operation are set for a period of time. In steady state, "slow" AGC parameters are set. The controller monitors the rate of change of a receive signal strength indicator (RSSI) and compares the rate of change against pre-selected thresholds to determine if a change in loop parameters is required. The controller further adjusts DC-cancellation parameters when analog gain is switched. The controller may also set a flag responsive to LNA gain. When LNA gain is modified to adjust overall gain in the analog receiver path, the controller initiates a phase compensation process at a gain/phase compensator at the baseband interface.

An embodiment of the AGC circuit includes a loop filter, an analog control branch, and a digital control branch. The loop filter receives the difference of a reference value and a representation of the receive signal power from the digital receiver path. The loop filter generates an error signal that is applied to both the analog control branch and the digital control branch. The analog control branch includes a first adder, a programmable hysteresis element, and a lookup table. The first adder receives the error signal from the loop filter and a first calibration value. The output of the first adder is forwarded to the programmable hysteresis element which applies one or more adjustable delays in accordance with one or more threshold values to the output signal from the adder. The output from the programmable hysteresis element is forwarded to the lookup table to select a control signal. The control signal is forwarded to both the digital control branch and the analog receiver path. The control signal is configured to adjust the gain of one or more elements in the analog receiver path. The digital control branch includes a second adder, a programmable delay element, and a converter. The programmable delay element adjusts the control signal received from the analog control branch to align the control signal in time with the error signal. The delayed representation of the analog control signal, the error signal and the second calibration value are applied at the second adder. The second adder forwards the sum of the error signal, the second calibration value, and the delayed representation of the control signal to the converter. The converter transforms the output from the second adder from a logarithmic value to a linear control word. The control word is forwarded to the scaler to adjust signal gain in the digital domain in the receiver.

An alternative embodiment of the AGC circuit receives a gain value from the baseband subsystem and replaces the error signal from the loop filter (e.g., by the opening of a switch) with the gain value. The received gain value is forwarded from the baseband subsystem to the first and second feedback adders. The gain value and a first calibration value are forwarded to the analog control branch. In operation, the total gain change provided by the baseband is loaded into a register. Appropriate gain thresholds are loaded into the lookup table and the calibration value is supplied to the first feedback adder. The programmable hysteresis element is bypassed or disabled. The remaining portions of the analog and digital control paths are reused. The AGC circuit further applies the gain value and a second calibration value to the digital control branch. The analog control branch generates a control signal that is coupled to one or more elements in the analog receiver path to control gain in the receiver. The digital control branch generates a control word that is coupled to the scaler to control gain in the digital domain. Accordingly, gain control in both embodiments is distributed between analog and digital control elements.

The circuits, systems, and methods for managing AGC in the quadrature paths of a receiver can be implemented in hardware, software, or a combination of hardware and software. When implemented in hardware, the systems, circuits and methods can be implemented using specialized hardware elements and logic. When the circuits, systems and methods are implemented partially in software, the software portion can be used to control components in the circuit so that various operating aspects can be software-controlled. The software, as well as gain steps, calibration and reference values can be stored in a memory, accessed and executed by a suitable instruction-execution system (microprocessor). A hardware implementation of the systems, circuits and methods can include any or a combination of the following technologies, which are all well known in the art: discrete electronic components, a discrete logic circuit(s) having logic gates for implementing logic functions upon data signals, an application-specific integrated circuit having appropriate logic gates, a programmable gate array(s) (PGA), a field programmable gate array (FPGA), etc.

The software for managing AGC in a RF subsystem of a wireless communication system comprises an ordered listing of executable instructions for implementing logical functions, and can be embodied in any computer-readable medium for use by or in connection with an instruction execution system, apparatus, or device, such as a computer-based system, processor-containing system, or other system that can fetch the instructions from the instruction execution system, apparatus, or device and execute the instructions.

In the context of this document, a "computer-readable medium" can be any means that can contain, store, communicate, propagate, or transport the program for use by or in connection with the instruction execution system, apparatus, or device. The computer-readable medium can be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection (electronic) having one or more wires, a portable computer diskette (magnetic), a random access memory (RAM), a read-only memory (ROM), an erasable programmable read-only memory (EPROM or Flash memory) (magnetic), an optical fiber (optical), and a portable compact disc read-only memory (CDROM) (optical). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

FIG. 1 is a block diagram illustrating a simplified wireless communication system 100 including a radio-frequency automatic gain control (RF AGC) system 238. The wireless communication system 100 includes a baseband subsystem 110, an input/output (I/O) element 112, a transmitter 130, a front-end module 140, an antenna 145, and a receiver 150. The I/O element 112 is coupled to the baseband subsystem 110 via connection 114. The I/O element 112 represents any interface with which a user may interact with the wireless communication system 100. For example, the I/O element 112 may include a speaker, a display, a keyboard, a microphone, a trackball, a thumbwheel, or any other user-interface element. A power source (not shown), which may be a direct-current (DC) battery or other power source, is also connected to the baseband subsystem 110 to provide power to the wireless communication system 100. In a particular embodiment, the wireless communication system 100 can be, for example but not limited to, a portable-telecommunication device such as a mobile cellular-type telephone.

The baseband subsystem 110 includes microprocessor (.mu.P) 115 and memory 116. The microprocessor 115 and the memory 116 are in communication with each other. Depending on the manner in which the RF AGC system 238 and methods for managing AGC in the quadrature signal paths of a receiver are implemented, the baseband subsystem 110 may also include one or more of an application-specific integrated circuit (ASIC), a field programmable gate array (FPGA), or any other implementation-specific or general processor, among other devices.

The baseband subsystem 110, via microprocessor 115 and the memory 116, provides the signal timing, processing, and I/O storage functions for wireless communication system 100. In addition, the baseband subsystem 110 generates various control signals, such as power control signals, filter control signals, and modulator control signals that are used to direct various functions within the transmitter 130 and the receiver 150, as known to those skilled in the art. The various control signals may originate from the microprocessor 115 or from any other processor within the baseband subsystem 110, and are supplied to a variety of connections within the transmitter 130 and the receiver 150. It should be noted that, for simplicity, only the basic components of the wireless communication system 100 are illustrated herein.

If portions of the RF AGC system 238 and methods for managing AGC in the quadrature paths of a receiver are implemented in software that is executed by the microprocessor 115, the memory 116 will also include gain control software 118. The gain control software 118 comprises one or more executable code segments and or data values that can be stored in the memory 116 and executed in the microprocessor 115. Alternatively, the functionality of the gain control software 118 can be coded into an ASIC (not shown) or can be executed by an FPGA (not shown), or another device. Because the memory 116 can be rewritable and because a FPGA is reprogrammable, updates to the gain control software 118 including gain stages or ranges, calibration data, and a reference value can be remotely sent to and saved in the wireless communication system 100 when implemented using either of these methodologies.

In a preferred embodiment, the gain control software 118 includes one or more executable code segments for configuring the RF AGC system 238 to operate in conjunction with other receiver elements and the baseband subsystem 110. A power estimator, a loop filter, a delay element, a programmable hysteresis element, one or more programmable digital filters, and entries in a lookup table, as well as one or more converters, can be configured or controllably updated as desired to permit the RF AGC system 238 to operate in both WCDMA and GSM/EDGE modes of operation. The arrangement and operation of the power estimator, loop filter, delay element, programmable hysteresis element, lookup table, digital filters, and the one or more converters will be explained in association with the functional block diagrams of FIG. 2, FIG. 3 and FIG. 5.

The baseband subsystem 110 transforms digital communication information within baseband subsystem 110 into analog signals for transmission by the transmitter 130. More specifically, the baseband subsystem 110 uses digital-to-analog converters (not shown) to generate the in-phase (I) and quadrature-phase (Q) transmit signals that are applied via bus 120 to the transmitter 130.

The transmitter 130 includes a modulator (not shown), which modulates the analog signals and provides a modulated signal to an upconverter (not shown). The upconverter transforms the modulated signal on to an appropriate transmit frequency and provides the upconverted signal to a power amplifier (not shown). The power amplifier amplifies the upconverted signal to an appropriate power level for the communication protocol or standard in which the wireless communication system 100 is designed to operate. The modulated, upconverted, and amplified transmit signal is forwarded to front-end module 140 via connection 132. Details of the transmitter 130 have been omitted, as they will be understood by those skilled in the art. For example, when the power amplifier is used in a constant-amplitude, phase (or frequency) modulation application such as GSM, the phase-modulated information is provided by a modulator within the transmitter 130. When a power amplifier (not shown) is used in an application requiring both phase and amplitude modulation such as, for example, for GSM\EDGE, the Cartesian in-phase (I) and quadrature (Q) components contain both amplitude and phase information.

The front-end module 140 comprises an antenna system interface that may include, for example, a diplexer having a filter pair that allows simultaneous passage of both transmit signals and receive signals in respective frequency ranges, as known to those skilled in the art. The transmit signal is supplied from the front-end module 140 to the antenna 145 for signal transmission to suitable configured communication devices remote from wireless communication system 100.

A signal received by an antenna 145 is directed from the front-end module 140 to the receiver 150 via connection 142. The receiver 150 includes various components to downconvert, digitize, and filter a recovered data signal from a receive signal, as known to those skilled in the art. A mixing stage downconverts and separates the received RF signal into in-phase (I) and quadrature-phase (Q) receive signals. The I and Q receive signals are sampled and transformed into digital signals by one or more ADCs. One or more specialized digital filters are introduced to further process the I and Q receive signals.

The RF AGC system 238 is introduced to dynamically and selectively manage AGC in the receiver 150. After dynamic (i.e., controlled) correction for gain and phase imbalances, the corrected I and Q signals are demodulated and further processed in the baseband subsystem 110.

The transmitter 130 and the receiver 150 may be collocated in an integrated transceiver, such as when the transmitter 130 and the receiver 150 are implemented on a RF integrated circuit (IC). In alternative embodiments, the receiver 150 and the transmitter 130 are implemented on separate ICs. Under both architectures, the RF AGC system 238 is preferably implemented in hardware on an integrated circuit in the receiver 150.

Figure 2:
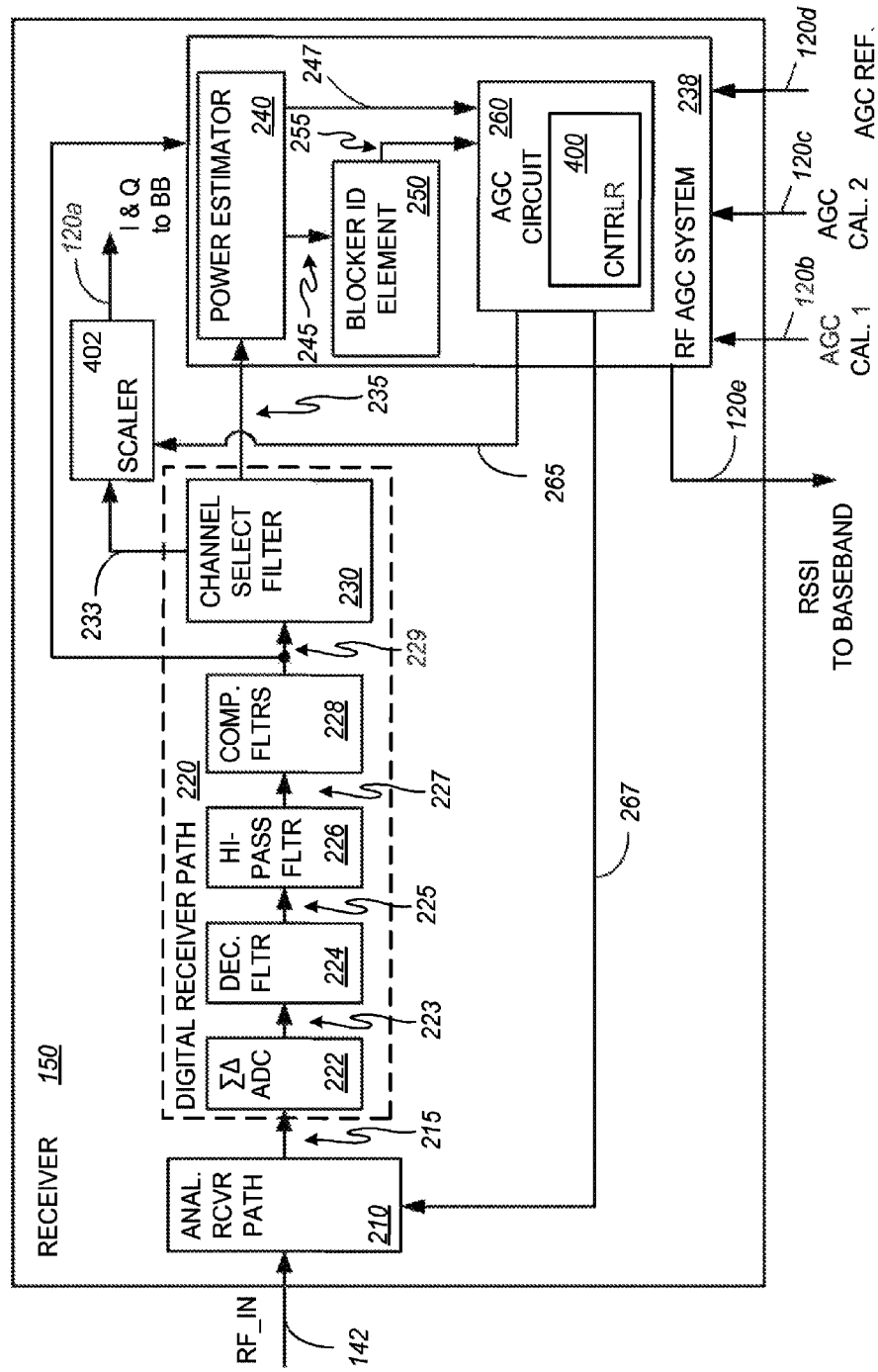
FIG. 2 is a functional block diagram illustrating an example embodiment of a WCDMA receiver.

FIG. 2 is a functional block diagram illustrating an example embodiment of the receiver 150 of FIG. 1. The receiver 150 receives a RF-input signal (RF_IN) on connection 142 which is coupled to an analog receiver path 210 and via connection 215 to a digital receiver path 220. The analog receiver path 210 includes mixers, amplifiers, and/or attenuators. The mixers are configured to separate the I (i.e., in-phase) receive signal and Q (i.e., quadrature-phase) receive signal components from the RF-input signal. The amplifiers and or attenuators in the analog receiver path 210 under the control of a control signal on connection 267 adjust the receive signal power. The digital receiver path 220 includes a series combination of a sigma-delta analog to digital converter 222, a decimation filter 224, a high-pass filter 226, compensation filters 228, and a channel select filter 230. As illustrated in FIG. 2, the digitized version of the receive signal is forwarded on connection 223 from the sigma-delta analog to digital converter 222 to the decimation filter 224. The decimated and digitized representation of the receive signal is forwarded via connection 225 from the decimation filter 224 to the high-pass filter 226, which reduces the magnitude of signal components below a corner frequency. The high-pass filtered representation of the receive signal is forwarded on connection 227 to a set of compensation filters 228. The output of the compensation filters 228 is forwarded on connection 229 to the channel select filter 230 and to the RF AGC system 238.

The channel select filter 230, under the control of one or more signals (not shown) from the baseband subsystem 110, passes a select range of frequencies, i.e., a select receive channel, to the RF AGC subsystem 238 on connection 235 and on connection 233 to a scaler 402. In addition to receiving a select receive channel on connection 235, the RF AGC subsystem 238 receives a first calibration signal on connection 120b, a second calibration signal on connection 120c and an AGC reference signal on connection 120d. As further illustrated in FIG. 2, the RF AGC system 238 generates three output signals. A receive signal strength indicator (RSSI) signal is communicated to the baseband subsystem 110 on connection 120e. An analog control signal is communicated from the AGC circuit 260 to the analog receiver path 210. The analog control signal on connection 267 includes information for setting or otherwise controlling the gain of one or more controllable elements in the analog receiver path 210. In addition, a digital control word is communicated from the AGC circuit 260 to the scaler 402 on connection 265. The scaler 402 is a digital gain element. That is, the scaler 402, in response to the digital control word on connection 265, adjusts the digital representation of the receive signal provided on connection 233 and forwards the same on connection 120a to the baseband subsystem 110.

In the illustrated embodiment, the RF AGC system 238 includes a power estimator 240, a blocker identification element 250 and an AGC circuit 260. The power estimator 240 forwards first and second power estimates. A first estimate of signal power is generated from a signal on connection 229, which originates at the input to the channel select filter 230. A second estimate of signal power is generated from a signal on connection 235 at the output of the channel select filter. As described above, when receive signal samples are processed at half the receiver sample rate, a single power estimator can be used to determine the signal power before and after the channel select filter. The first and second estimates of the receive channel power are forwarded to the blocker identification element on connection 245. The blocker identification element 250 includes logic that compares a difference of the first and second estimates with a threshold value to determine when a blocker is present in the receiver 150. When a blocker is present in the receiver 150, a signal indicating the same is forwarded along connection 255 to the AGC circuit 260. In addition, the power estimator 240 forwards the first estimate to the AGC circuit 260 on connection 247.

As described briefly above, the AGC circuit 260, operating in accordance with controller 400, uses an analog control path (not shown) to controllably adjust the gain of one or more of mixer/LNA stage(s), transimpedance amplifier(s), and programmable power amplifier(s) in the analog receiver path 210. When a LNA gain stage is adjusted, the controller 400 will forward an indication of the same to a gain/phase compensator (not shown). The gain/phase compensator, which can be implemented in the RF portion of the receiver 150 or in the baseband subsystem 110, performs a complex multiply operation on the I and Q data signals after the appropriate number of data signal samples have been processed. The gain and phase corrected I and Q data signals are further processed by the baseband subsystem 110 before being forwarded to the I/O element 112 (FIG. 1). As also explained above, the AGC circuit 260, operating in accordance with the controller 400, uses a digital control path (not shown) to generate a control word that is forwarded on connection 265 to controllably adjust the scaler 402.

Figure 3:
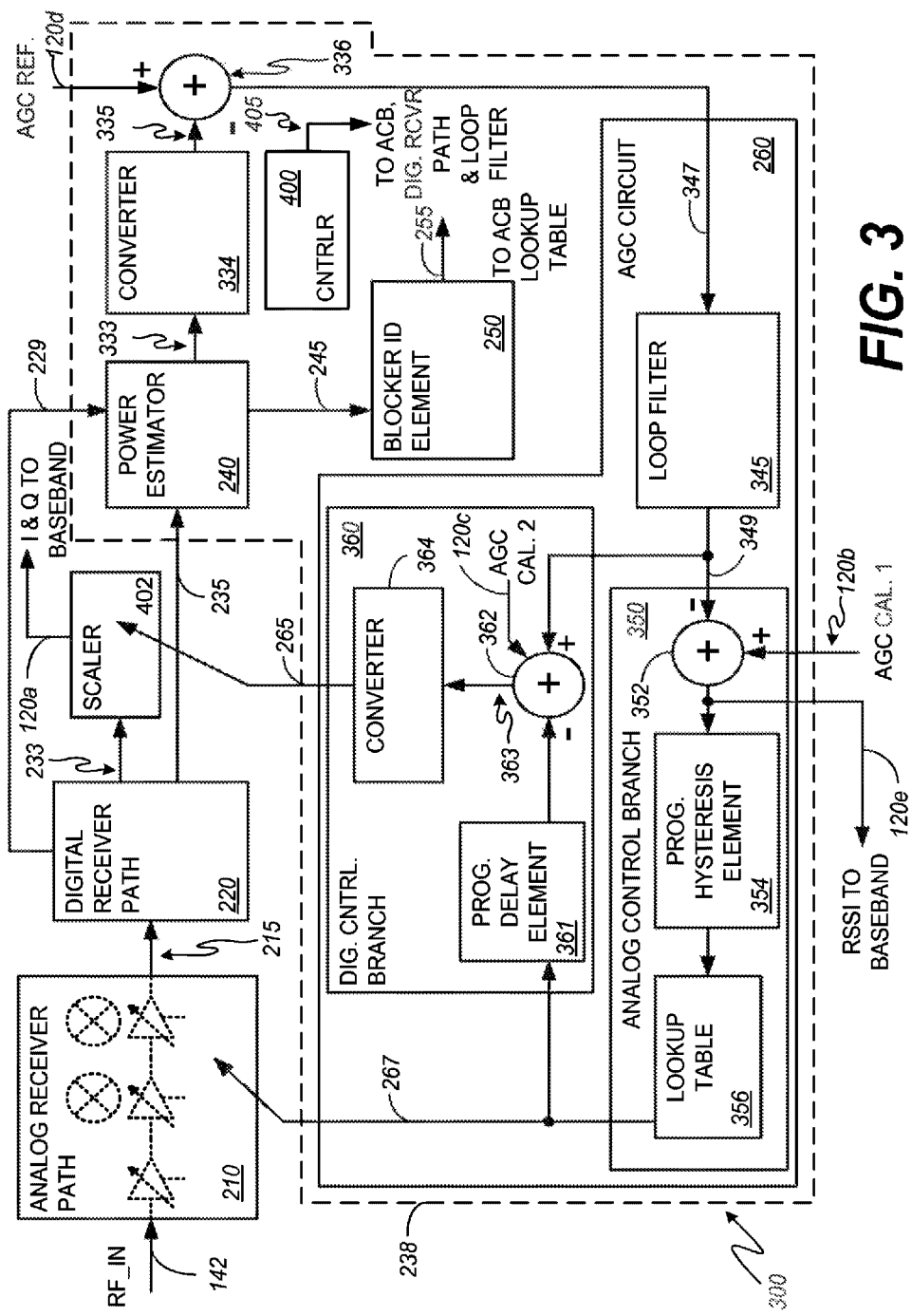
FIG. 3 is a functional block diagram illustrating an embodiment of the WCDMA receiver of FIG. 2.

FIG. 3 is a functional block diagram illustrating an embodiment of the RF AGC system 238 of FIG. 1. As illustrated in FIG. 3, a receiver 300 includes an analog receiver path 210, a digital receiver path 220, a scaler 402, and the RF AGC system 238. The analog receiver path 210 receives the RF_IN signal on connection 142 and a control signal on connection 267. The analog receiver path 210 includes series-coupled analog devices that amplify or attenuate the signal power (i.e., the RF_IN signal) in accordance with information encoded in the control signal on connection 267.

In an embodiment, the analog receiver path 210 includes one or more low-noise amplifiers (LNAs), one or more transimpedance amplifiers (TIAs), or one or more programmable gain amplifiers (PGAs) coupled in series. In an embodiment, the AGC circuit 260 is arranged to provide approximately 48 dB of analog gain control over 5 gain stages or ranges. Two of the gain stages are provided by a programmable gain amplifier. A first programmable amplifier gain stage provides approximately 10 dB of gain to the analog signal in the analog receiver path 210. A second programmable amplifier gain stage provides approximately 6 dB of gain to the analog signal. The remaining gain stages or ranges are provided by combinations of mixers and LNAs. First and third mixer/LNA gain stages provide approximately 10 dB of gain to the analog signal. A second mixer/LNA gain stage provides approximately 12 dB of gain to the analog signal. Other embodiments providing a smaller or larger total gain to the analog signal are possible. These other embodiments providing a total gain in the analog signal other than approximately 48 dB can be implemented by many different combinations of gain stages and combinations of amplifiers or attenuators as may be desired.

As is known, the analog receiver path 210 further includes analog elements for separating the in-phase (I) and quadrature phase (Q) components of the receive signal. When these analog elements for separating the I and Q components of the receive signal are arranged after the amplifiers or attenuators, the amplifiers and or attenuators may be arranged in a single signal path. Once the I and Q components of the receive signal are separated, it should be understood that separate amplifiers or attenuators should be applied in matched pairs to adjust the signal power of the I or in-phase receive signal channel and a Q or quadrature-phase receive signal channel. Thereafter, the power adjusted I and Q receive signals are forwarded on connection 215 to the digital receiver path 220.

As described above, the digital receiver path 220 includes analog to digital converters, decimation filters, high-pass filters, compensation filters, and a channel select filter (not shown). The digital receiver path 220 receives the power adjusted I and Q receive signals on connection 215. The digital receiver path 220 forwards a first digital representation of the sampled and filtered I and Q receive signals on connection 229 to the RF AGC system 238. The first digital representation of the I and Q receive signals forwarded on connection 229 includes the I and Q receive signals before they are processed in a channel select filter. The digital receiver path 220 is further configured to forward a second digital representation of the sampled and filtered I and Q receive signals on connection 235 to the RF AGC system 238. The second digital representation includes the I and Q receive signals after they have been processed by a channel select filter (not shown). A channel select filter passes only those signal components within a designated range of frequencies. When a blocker is present in the receiver 150, the signal power in the I and Q receive signals prior to processing in the channel select filter will be greater in magnitude than the signal power in the I and Q receive signals at the output of the channel select filter.

The second digital representation of the I and Q receive signals is forwarded to the scaler 402 on connection 233. The scaler 402 is a digital gain element. The scaler 402 adjusts the digital representation of the I and Q receive signals provided on connection 233 in accordance with a digital control word communicated from the AGC circuit 260 on connection 265.

As will be explained below, the AGC circuit 260 adjusts the control word in accordance with present operating conditions in the receiver 150 including the estimated power of the receive signal, the amount of analog gain provided in the analog receiver path 210, and a desired reference value. The scaler 402, in response to the digital control word on connection 265, digitally scales or adjusts the I and Q receive signals before forwarding the same to the baseband subsystem 110 on connection 120a. In an embodiment, the scaler 402 provides approximately 72 dB of digital gain control. Other embodiments providing a smaller or larger total gain to the digital I and Q receive signals are possible.

The RF AGC system 238 includes a power estimator 240, a converter 334, an adder 336, and additional elements. The power estimator 240 receives the channel select filtered I and Q receive signals via connection 235. The power estimator also receives a representation of the I and Q receive signals that have not been processed by the channel select filter (not shown) on connection 229. The power estimator 240 is arranged to calculate an estimate of the signal energy in the I and Q receive signals both before and after the channel select filter. The power estimator 240 is a hardware device configured to perform Equation 1 below.

$$\text{power} = 10\log_{10}\left(\frac{1}{N}\sum_{i=0}^{N-1} I_i^2 + Q_i^2\right) \quad \text{Equation 1}$$

N in Equation 1 is the number of samples used in the calculation. The summation operates in an integration and dump mode. Therefore, the subsequent functional blocks in the RF AGC system 238 operate at a frequency determined by the ratio of a sample frequency and the number of samples. The estimated signal energy for samples received from connection 235 are forwarded on connection 333 to the converter 334. The converter 334 is arranged to translate the estimated signal energy to a value in decibels using an algorithm that is illustrated and described in association with FIG. 8. The adder 336 receives a reference power in dB via connection 120d and the estimate of signal energy (in dB) from the converter 334 via connection 335. As illustrated in FIG. 3, the adder 336 generates and forwards the difference of the reference power and the estimate of signal energy to the AGC circuit 260 on connection 347.

The reference power is a programmable value. For the receiver 150 illustrated and described in FIG. 2, the reference power is set as follows. Since a WCDMA signal resembles white noise, its crest factor is assumed to be $F_S/3$, where $F_S$ is the full scale, $$E_{peak} = I_{peak}^2 + Q_{peak}^2 = F_S + F_S = 2F_S$$

Assuming a crest factor of ⅓, the average signal energy is:

$$E_{avg} = I_{avg}^2 + Q_{avg}^2$$
$$= \left(\frac{F_s}{3}\right)^2 + \left(\frac{F_s}{3}\right)^2$$
$$= \frac{2F_s}{9}.$$

The reference power can be determined as a ratio of the average signal energy and the peak signal energy as follows:

$$\frac{E_{avg}}{E_{peak}} = \frac{2F_s}{2F_{s/9}}$$
$$= \frac{1}{9}$$
$$= -9.5 \text{ dB}.$$

Allowing for a 3 dB margin, the reference power is set to −12.5 dB.

As further illustrated in FIG. 3, the RF AGC system 238 includes a blocker identification element 250 and a controller 400. The blocker identification element 250 receives a first estimate and a second estimate from the power estimator 240 on connection 245. The first estimate represents the signal power in the I and Q receive signals before the channel select filter. The second estimate represents the signal power in the I and Q receive signals after being processed by the channel select filter. The blocker identification element 250 includes logic configured to generate a blocker presence signal when a function of the first estimate and the second estimate exceeds a threshold value. As indicated in FIG. 3, the blocker presence signal is communicated via connection 255 to the lookup table 356 in the analog control branch 350. The lookup table includes one or more entries with information suitable for adjusting one or more controllable elements in the analog receive path 210 in response to the blocker presence signal to prevent the analog to digital converters in the digital receive path 220 from receiving respective input signals that exceed their dynamic range.

The controller 400 is a state machine that is coupled via connection 405 to a loop filter 345, multiple elements in the AGC circuit 260, and one or more filters in the digital receiver path. As will be explained in greater detail in association with the state diagram of FIG. 4, the controller 400 sets operational parameters for normal, power-up, and compressed modes of operation, among others. The operational parameters include but are not limited to a power calculation window size, one or more loop filter constants, corner frequencies for a DC-cancellation high-pass filter, one or more thresholds, etc.

The AGC circuit 260 includes a loop filter 345, the analog control branch 350, and the digital control branch 360. The loop filter 345 receives the error signal in decibels on connection 347 and is arranged to forward a filtered error signal in accordance with Equation 2 below. The filtered error signal is communicated on connection 349 to both the analog control branch 350 and the digital control branch 360.

$$\text{filtered\_error}(k) = \text{filtered\_error}(k-1) + K_{loop} \cdot \text{error}(k) \quad \text{Equation 2}$$

$K_{loop}$ is an AGC loop constant that is programmable and adjustable by the controller 400.

The analog control branch 350 includes a first feedback adder 352, a programmable hysteresis element 354, and a lookup table 356. The first feedback adder 352 receives the filtered error signal on connection 349 and a first calibration value on bus connection 120b. The first feedback adder 352 is arranged to forward the difference of the first calibration value and the filtered error signal to the programmable hysteresis element 354 and the baseband subsystem 110 (not shown) on bus connection 120e. The difference of the first calibration value and the filtered error signal is an indication of the receive signal strength or a receive signal strength indicator (RSSI). The first calibration value is a programmable value that can account for variation in receive signal strength due to frequency and temperature. When calibration data is not available for a present combination of temperature and frequency, a default value of approximately −18 dB is applied.

To prevent analog gain toggling, the programmable hysteresis element 354 provides a time or delay period, during which analog gain is not permitted to change. In addition, the time or delay period is applied with thresholds, which in conjunction with a previous gain state or stage are used to determine a new analog gain value.

The receive signal strength, as adjusted in time by the programmable hysteresis element 354, is used as an index to the lookup table 356, which determines the analog gain distribution corresponding to the receive signal power. The thresholds in the lookup table are programmable. Table 1 is an example of such a table.

TABLE 1

WCDMA ANALOG GAIN LUT

| Input Signal (dBm) | Total Analog Gain (dB) | LNA Gain (dB) | TIA Gain (dB) | PGA Gain (dB) |
|---|---|---|---|---|
| −110 | 55 | 27 (High) | 12 (High) | 16 (High) |
| −97 | 43 | 27 (High) | 6 (Mid) | 10 (Mid) |
| −82 | 34 | 24 (Mid) | 0 (Low) | 10 (Mid) |
| −72 | 22 | 12 (Low) | 0 (Low) | 10 (Mid) |
| −44 | 10 | 0 (Bypass) | 0 (Low) | 10 (Mid) |
| −33 | 0 | 0 (Bypass) | 0 (Low) | 0 (Low) |

In the embodiment illustrated in Table I, when an input signal threshold of −33 dBm is detected, the analog control branch 350 generates an analog control signal on connection 267 that directs the analog receiver path 210 to provide approximately 0 dB of gain in the analog receiver path 210. When an input signal threshold between −33 dBm and −44 dBm is detected, the analog control branch 350 changes the analog control signal on connection 267 to provide approximately 10 dB of total gain via a PGA in the analog receiver path 210. Similarly, when the input signal threshold falls between −44 dBm and −72 dBm, the analog control branch 350 changes the analog control signal on connection 267 to provide approximately 22 dB of total gain with approximately 10 dB of gain provided by the PGA and approximately 12 dB of additional gain provided by a LNA in the analog receiver path 210. When the input signal threshold falls between −72 dBm and −82 dBm, the analog control branch 350 changes the analog control signal on connection 267 to provide approximately 34 dB of total gain with approximately 10 dB of gain provided by the PGA and approximately 24 dB of additional gain provided by one or more LNAs in the analog receiver path 210. When the input signal threshold falls between −82 dBm and −97 dBm, the analog control branch 350 changes the analog control signal on connection 267 to provide approximately 43 dB of total gain with approximately 10 dB of gain provided by the PGA, approximately 6 dB of gain provided by a transimpedance amplifier, and approximately 27 dB of additional gain provided by one or more LNAs in the analog receiver path 210. Lastly, when the input signal threshold falls between −97 dBm and −110 dBm, the analog control branch 350 changes the analog control signal on connection 267 to provide approximately 55 dB of total gain with approximately 16 dB of gain provided by the PGA, approximately 12 dB of gain provided by a transimpedance amplifier, and approximately 27 dB of additional gain provided by one or more LNAs in the analog receiver path 210.

Other embodiments including other analog gain stages different from those illustrated in Table 1 are contemplated. For example, more or less analog gain stages or steps may be provided by other combinations of amplifiers and controllable attenuators. The additional amplifiers could include a LNA, a TIA, a PGA, two or more LNAs, two or more TIAs, two or more PGAs, or combinations of the above with any number of controllable attenuators (with multiple ranges of attenuation) to achieve the desired gain stages.

As indicated in Table 1 an analog control signal for adjusting the gain in an analog receiver path 210 could include a suitable code for representing any one of low, mid, or high-range gain states to one or more LNAs, one or more TIAs, or one or more PGAs, as desired. Alternative arrangements of controllable elements in an analog receiver path could be similarly controlled over any number of desired control ranges using any number of control signals encoded to communicate desired combinations of elements and gain states. Although the embodiment presented in Table I does not include an attenuator, it should be understood that the analog control branch 350 and the analog receiver path 210 are not so limited.

LNA gain changes require a phase correction to be applied to the I and Q receive signal components before being forwarded to the baseband subsystem 110 (FIG. 1). Accordingly, the lookup table 356 may further include rotation factors (not shown) that are used in a phase correction. Before forwarding the I and Q values to the baseband subsystem 110 with an appropriate delay corresponding the receive path filter delays, a complex multiplication between I+jQ and cos(.PHI.)+j sin (.PHI.) is performed when the LNA gain state is switched. The rate of change of the analog gain is defined by Equation 3.

$$\Delta t_{analog\ gain} = \frac{N}{f_S} \times Gainhold \qquad \text{Equation 3}$$

where, N is the power estimation window size;
$f_S$ is the power calculation sampling rate; and
Gainhold is the analog gain change delay in units of number of samples.

The digital control branch 360 includes a programmable delay element 361, a second feedback adder 362, and a converter 364. The programmable delay element 361 synchronizes the analog control signal on connection 267 with the filtered error signal on connection 349 from the loop filter 345. The second feedback adder 362 receives the filtered error signal on connection 347, a second calibration value on connection 120c, and the delayed analog control signal from the delay element 361. As illustrated in FIG. 3, the second feedback adder 362 generates and forwards the difference of the filtered error signal, the second calibration value, and the delayed analog control signal on connection 363 to the converter 364. The converter 364 generates a control word after translating the digital gain from decibels to a linear value. The control word is forwarded via connection 265 to the scaler 402. A method for converting decibels to a linear unit is illustrated and described in association with FIG. 9.

Figure 4:
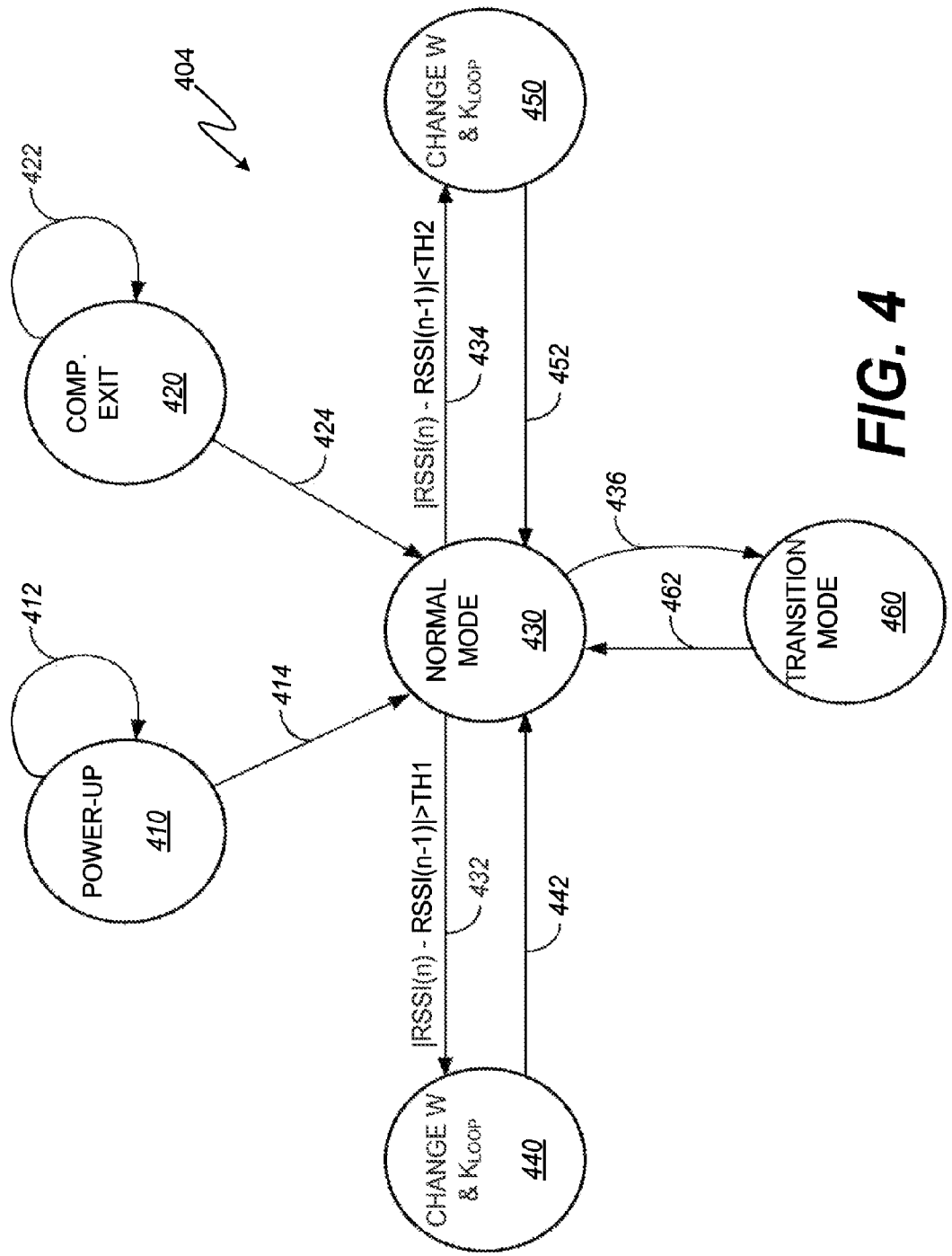
FIG. 4 is a state diagram illustrating an embodiment of a controller.

FIG. 4 is a state diagram illustrating an embodiment of the controller 400 that enables autonomous operation of the AGC circuit 260. The state diagram of FIG. 4 shows the architecture, functionality, and operation of a possible implementation of a controller via software and or firmware associated with the RF AGC system 238. In this regard, each circle represents a set of conditions and the arrows between circles describe the behavior of the controller 400. It should be understood that the controller 400 can be implemented in hardware, firmware, or software. When the RF AGC system 238 is implemented via hardware, hardware and firmware, or a combination of hardware and software, one or more combinations of states and arrows in the state diagram may represent an additional circuit or circuits. Alternatively, the described functions can be embodied in source code including human-readable statements written in a programming language or machine code that comprises instructions recognizable by a suitable execution system such as a processor in a computer system. The machine code may be converted from the source code, etc.

To provide autonomous operation of the AGC circuit 260, the controller 400 sets operational parameters for normal, power-up, and compressed modes of operation, among others. The operational parameters include but are not limited to a power calculation window size, one or more AGC loop filter constants, corner frequencies for a DC-cancellation or high-pass filter that can be applied in one or multiple steps (in the digital receiver path 220), rate thresholds, and mode timers. In addition, a transition timer may be set. The transition timer is used by the controller 400 to adjust a corner frequency for the high-pass filter in response to an analog gain change (in one or multiple steps) and to return the corner frequency to a first frequency when the timer has elapsed. Under some circumstances, it may be desirable to manage the loop filter constant and the power calculation window dynamically.

The state diagram 404 includes state 410, state 420, state 430, state 440, state 450, and state 460. State 410 is a power-up mode of operation. A set of suitable parameters for operating the AGC circuit 260 under power-up conditions are applied repeatedly as shown by arrow 412 until a select number of repetitions have been met. When the AGC circuit 260 has performed the select number of repetitions, the controller 400 transitions to state 430, as shown by arrow 414.

State 420 is a compressed mode of operation. A set of suitable parameters for operating AGC circuit 260 in a compressed mode are applied repeatedly as shown by arrow 422 until a select number of repetitions have been met. When the AGC circuit 260 has performed the select number of repetitions, the controller 400 transitions to state 430, as indicated by arrow 424.

State 430 is a normal mode of operation. A set of suitable parameters for operating the AGC circuit 260 under normal operating conditions are applied. In state 430, the controller 400 compares the rate of change of the estimated RSSI from the AGC circuit 260 with first and second threshold values. When the rate of change exceeds a first threshold, the controller 400 transitions as indicated by arrow 432 to state 440. In state 440, the controller 400 adjusts the power calculation window and the loop filter constant in a first manner (e.g., to speed up the feedback loop). Once the controller 400 has made the adjustments indicated in state 440, the controller 400 transitions back to state 430, as indicated by arrow 442. Otherwise, when the rate of change is less than a second threshold, the controller 400 transitions, as indicated by arrow 434, to state 450. In state 450, the controller 400 adjusts the power calculation window and the loop filter constant in a second manner (e.g., to slow down the feedback loop). Once the controller 400 has made the adjustments indicated in state 450, the controller 400 transitions back to state 430, as indicated by arrow 452.

State 460 is a transition mode of operation. A set of suitable parameters for operating the AGC circuit 260 in a transition mode are applied in response to an indication that the analog gain has changed as shown by arrow 436. When the analog gain changes, the controller 400 applies a DC-offset correction filter for a select period of time. When the AGC circuit 260 has applied the DC-offset correction filter for the select period time, one or more filter parameters (e.g., a corner frequency) may be returned to a normal mode setting as indicated by arrow 462.

Figure 5:
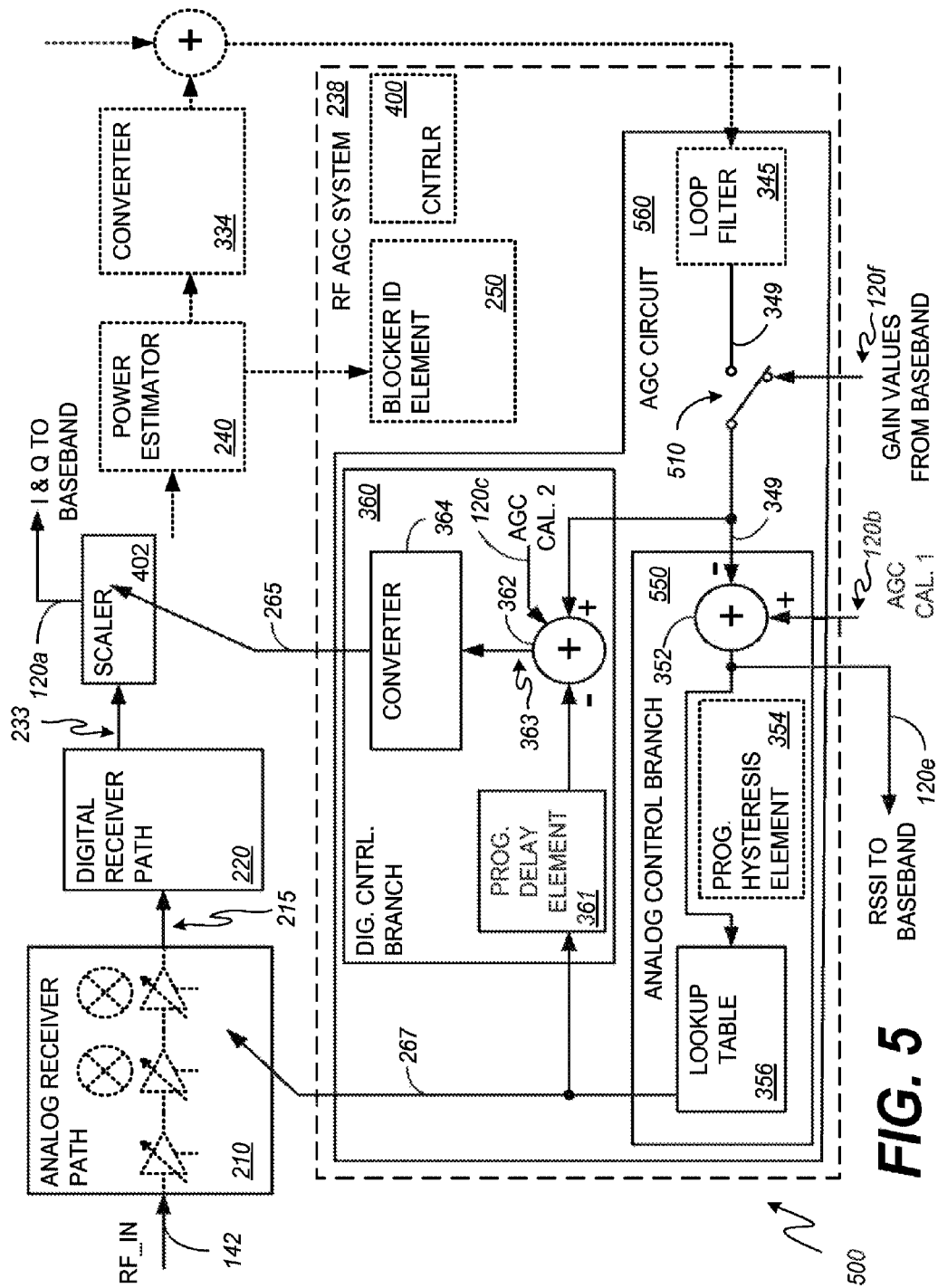
FIG. 5 is a functional block diagram illustrating an alternative embodiment of the AGC circuit of FIG. 1.

FIG. 5 is a functional block diagram illustrating an alternative embodiment of the AGC circuit of FIG. 3. The AGC circuit 560 is suitable for use in a GSM/EDGE mode of transceiver operation. The AGC circuit 560 shares several of the circuit elements from the AGC circuit 260 illustrated in FIG. 3 and described above. As illustrated in FIG. 5, the AGC circuit 560 is implemented in a receiver 500 that includes an analog receiver path 210, a digital receiver path 220, and a scaler 402. The analog receiver path 210 operates in accordance with a control signal provided by an analog control branch 550. The scaler 402 operates in accordance with a control word provided by the digital control branch 360. The power estimator 240, converter 334, adder 336, blocker identification element 250, controller 400, and loop filter 345 are illustrated in dashed lines to show that they have been disabled or otherwise removed from the other elements in the receiver 500. In the illustrated embodiment, a switch 510 is controllably positioned to provide gain values from the baseband subsystem 110 (FIG. 1) via connection 120f to the analog control branch 550 and the digital control branch 360. As further illustrated in FIG. 5, the switch 510 no longer couples connection 349 (i.e., the output of the loop filter 345) to the analog control branch 550 and the digital control branch 360. In addition, the programmable hysteresis element 354 is disabled and bypassed via connection 120e. Alternatively, the programmable hysteresis element 354 is operated in a bypass mode to apply the difference of the first calibration value and the gain value from the baseband subsystem 110 to the lookup table 356.

The analog receiver path 210 receives the RF_IN signal on connection 142 and provides an amplified version of the I and Q receiver components in accordance with the control signal on connection 267 to the digital receiver path 220. The analog receiver path 210 may include mixers, one or more low-noise amplifiers (LNAs), or one or more programmable power amplifiers (PGAs). In an embodiment, the analog control branch 550 is arranged to provide approximately 54 dB of analog gain control over 6 gain stages or ranges. Two of the gain stages are provided by a programmable amplifier. A first programmable amplifier gain stage provides approximately 6 dB of gain to the analog signal. A second programmable amplifier gain stage provides approximately 6 dB of gain to the analog signal. Two additional gain stages are provided by mixers in the analog receiver path 210. A first mixer gain stage provides approximately 10 dB of gain to the analog signal. A second mixer gain stage provides approximately 10 dB of additional gain to the analog signal. The remaining gain stages or ranges are provided by one or more LNAs. A first LNA gain stage provides approximately 14 dB of gain to the analog signal. A second LNA gain stage provides approximately 14 dB of additional gain to the analog signal. Other embodiments providing a smaller or larger total gain to the analog signal are possible. These other embodiments providing a total gain in the analog signal other than approximately 54 dB can be implemented by many different combinations of gain stages.

The digital receiver path 220 receives the amplified versions of the I and Q receive signals on connection 215. The digital receiver path 220 includes one or more signal processing elements that sample, digitize, high-pass filter, and compensate for power variation over frequency in the communication path traversed by the I and Q receive signals. In addition, the digital receiver path 220 may include a channel select filter for removing undesired frequencies below a low-frequency threshold and undesired frequencies above a high-frequency threshold. The output of the digital receiver path 220 is forwarded on connection 233 to a scaler 402. The scaler 402 is a digital gain element that operates in accordance with a control word received on connection 265 from the digital control branch 360. The power adjusted I and Q signals generated from the received analog signal are forwarded via bus connection 120a to the baseband subsystem 110 (FIG. 1). In one embodiment, the digital receiver path 220 provides approximately 72 dB of digital gain control. Other embodiments providing a smaller or larger total gain to the digital I and Q signals are possible.

The analog control branch 550 includes a first feedback adder 352 and a lookup table 356. The first feedback adder 352 receives the gain value from the baseband subsystem 110 on connection 349 and a first calibration value on connection 120b. The first feedback adder 352 is arranged to forward the difference between the first calibration value and the total gain loaded from the baseband subsystem 110 (not shown) on connection 120f. The difference between the first calibration value and the gain value is a RSSI. The first calibration value is a programmable value that can account for variation in receive signal strength due to frequency and temperature. The RSSI is used as an index to the lookup table 356, which determines the analog gain distribution corresponding to antenna power. The thresholds in the table are programmable. Table 2 is an example embodiment of such a table.

TABLE 2

GSM/EDGE ANALOG GAIN LUT

| Switching Threshold (dBm) | Analog Gain (dB) | Gain Stage (dB) |
| --- | --- | --- |
| −100 | 54 | PGA (6) |
| −83 | 48 | PGA (6) |
| −59 | 38 | Mixer (10) |
| −47 | 28 | Mixer (10) |
| −35 | 14 | LNA (14) |
| −33 | 0 | LNA (14) |

In the embodiment illustrated in Table 2, when a switching threshold of −33 dBm is detected, the analog control branch 550 generates an analog control signal on connection 267 that directs the analog receiver path 210 to provide approximately 0 dB of gain in the analog receiver path 210. When a switching threshold between −33 dBm and −35 dBm is detected, the analog control branch 550 changes the analog control signal on connection 267 to provide approximately 14 dB of gain via a LNA in the analog receiver path 210. Similarly, when the switching threshold falls between −35 dBm and −47 dBm, the analog control branch 550 changes the analog control signal on connection 267 to provide approximately 14 dB of gain via a first LNA and approximately 14 dB of additional gain via a second LNA in the analog receiver path 210 for a total analog gain of approximately 28 dB. Table 2 illustrates additional gain stages or states of analog gain control that can be applied to the LNAs, mixers, and PGAs in the analog receiver path 210 as may be desired.

Other embodiments including other analog gain stages different from those illustrated in Table 2 are contemplated. For example, when passive mixers are used one or more gain stages or steps may be provided by one or more additional amplifiers. The additional amplifiers could include a LNA, a PGA, two or more LNAs, two or more PGAs, or combinations of one or more LNAs with one or more PGAs to achieve the desired gain stages. In addition, one or more attenuators could be introduced in the analog receiver path 210 to allow for further control of the gain. As described above, the control signal on connection 267 will include information suitable for realizing desired gain stages in accordance with the architecture of the analog receiver path 210.

The digital control branch 360 includes a programmable delay element 361, a second feedback adder 362, and a converter 364. The second feedback adder 362 receives the baseband provided gain values via connection 349, a second calibration value via connection 120c, and a delayed representation of the analog gain from the programmable delay element 361. As illustrated in FIG. 5, the second feedback adder 362 generates and forwards the difference of the gain value, the second calibration value, and the analog gain received from the programmable delay element 361 on connection 363 to the converter 364. The converter 364 generates a control word after translating the digital gain from decibels to a linear value. The control word is forwarded via connection 265 to the scaler 402. A method for converting decibels to a linear unit is illustrated and described in association with FIG. 9.

Figure 6:
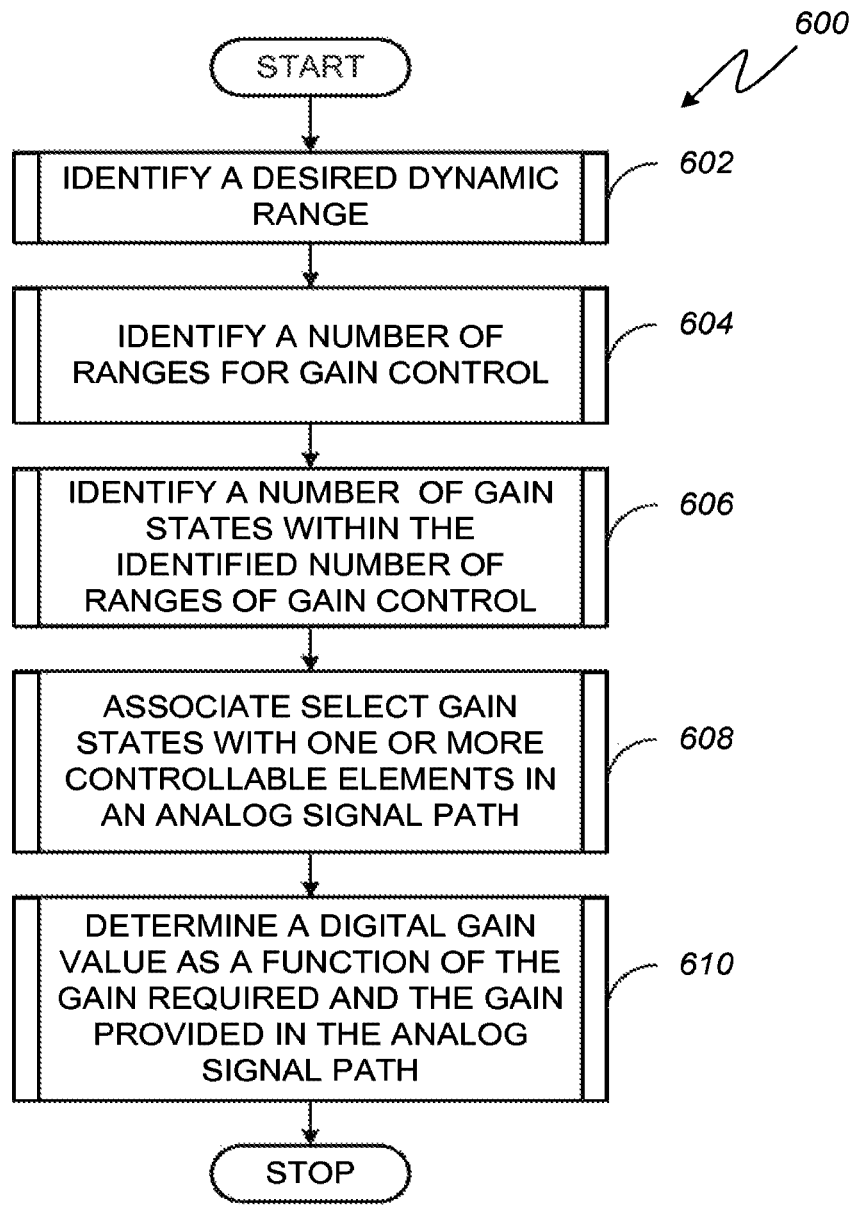
FIG. 6 is a flow chart illustrating an embodiment of a method for managing automatic gain control in quadrature paths of a radio-frequency subsystem of a wireless communication system.

FIG. 6 is a flow chart illustrating an embodiment of a method for implementing an analog gain control signal. The flow diagram of FIG. 6 shows the architecture, functionality, and operation of a possible implementation via a circuit or circuits, software, and or firmware associated with the receiver 150 of FIG. 1 or the receiver 500 of FIG. 5. When the AGC circuit 260 is implemented via hardware, hardware, and firmware, or a combination of hardware and software, one or more blocks in the flow diagram may represent an additional circuit or circuits. Alternatively, the described functions can be embodied in source code including human-readable statements written in a programming language or machine code that comprises instructions recognizable by a suitable execution system such as a processor in a computer system. The machine code may be converted from the source code, etc.

Method 600 begins with block 602 where a desired dynamic range is identified based on the maximum expected power in a receive signal, a reference sensitivity and blocker requirements. In block 604, a number of ranges of gain control are identified. Thereafter, as indicated in block 606, a number of gain states are identified within the identified number of ranges of gain control. In block 608, select gain states are associated with one or more controllable elements in the analog receiver path of a receiver. Thereafter, as indicated in block 610, a digital gain to be applied in the digital receiver path of the receiver is determined as a function of the total gain desired and the gain provided in the analog receiver path.

Figure 7:
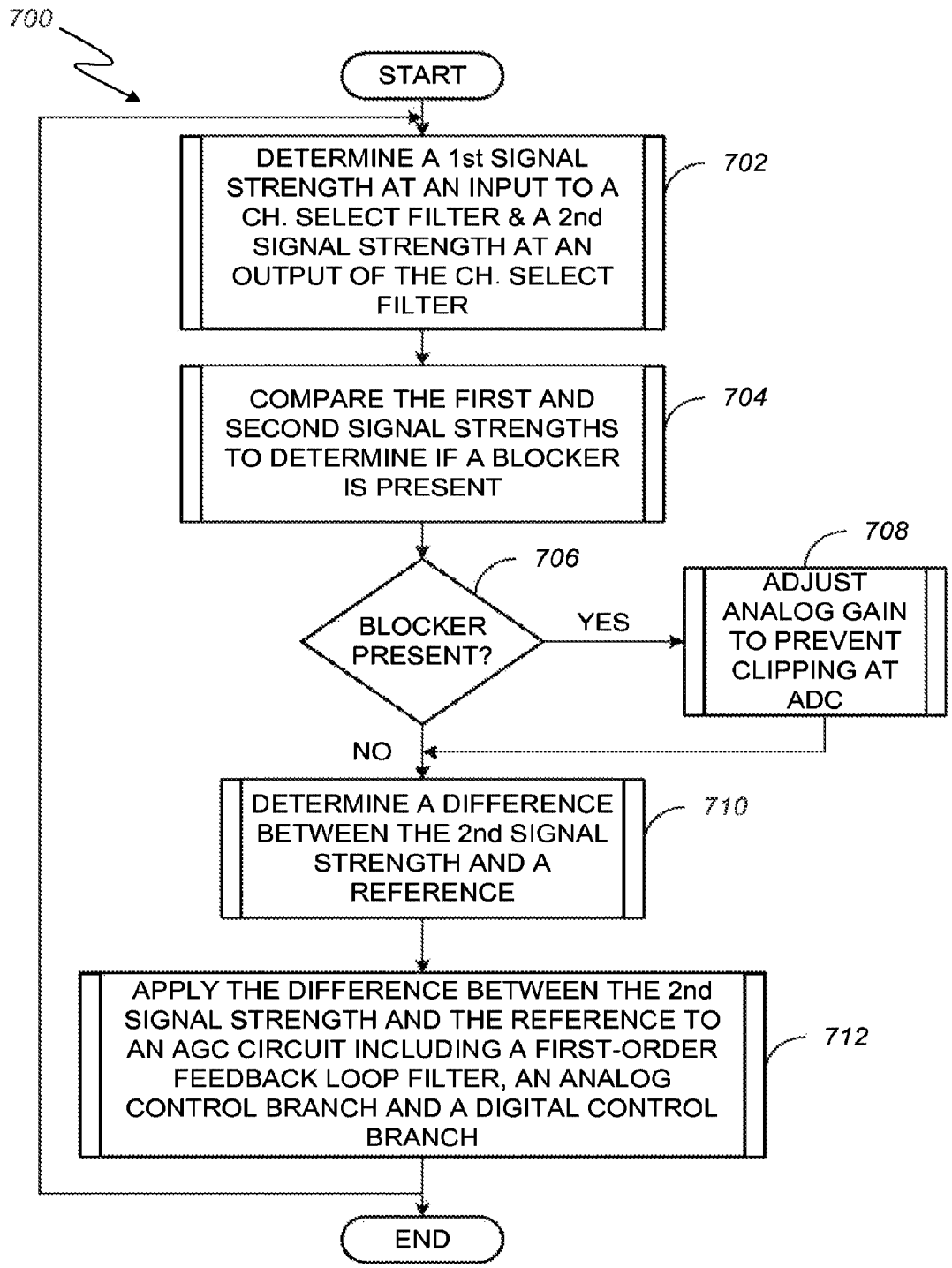
FIG. 7 is a flow chart illustrating an alternative embodiment of a method for managing automatic gain control in quadrature paths of a radio-frequency subsystem of a wireless communication system.

FIG. 7 is a flow chart illustrating an embodiment of a method for managing automatic gain control in quadrature paths of a RF subsystem of a wireless communication system. The flow diagram of FIG. 7 shows the architecture, functionality, and operation of a possible implementation via a circuit or circuits, software, and or firmware associated with the receiver 150 of FIG. 1 or the receiver 500 of FIG. 5. In this regard, each block represents a module, segment, or portion of code, which comprises one or more executable instructions for implementing the specified function(s). When the AGC circuit 260 or the AGC circuit 560 is implemented via hardware, hardware and firmware, or a combination of hardware and software, one or more blocks in the flow diagram may represent an additional circuit or circuits. Alternatively, the described functions can be embodied in source code including human-readable statements written in a programming language or machine code that comprises instructions recognizable by a suitable execution system such as a processor in a computer system. The machine code may be converted from the source code, etc.

Method 700 begins with block 702 where a first signal strength at an input to a channel select filter is determined and a second signal strength at an output of the channel select filter is determined. As described above, a power estimator can be used to determine both the first and second signal strengths when the signal data is forwarded to the power estimator at one half the receiver sample rate. Thereafter, as indicated in block 704, the first and second signal strengths are compared to determine if a blocker is present in the receive signal. In decision block 706, it is determined if a blocker is present. A difference of the first and second signal strengths can be compared with a threshold value to identify when a blocker is present in the receiver.

As shown in block 708, when a blocker is present, one or more analog gain stages are adjusted by forwarding a blocker presence signal to an analog control branch of an automatic gain control circuit. The analog control branch includes a lookup table with information arranged to communicate a control signal that when applied to the analog receive path reduces the signal power to prevent saturation or clipping of the receive signal at an ADC. Otherwise, when a blocker is not present, a difference between the second signal strength (i.e., the filtered receive signal) and a reference value is determined to generate an error signal. Thereafter, the difference or error signal is applied to a first-order feedback loop having an analog control branch and a digital control branch, as shown in block 712. As described above, the analog control branch provides an analog gain control signal to controllable elements in the analog receiver or signal path to provide a desired analog gain control. As also described above, the digital control branch operates in accordance with the difference of the error signal and the analog gain signal to generate a control word that adjusts a scaler 402 coupled in series with the channel select filter to provide a desired amount of gain in the digital domain.

Figure 8:
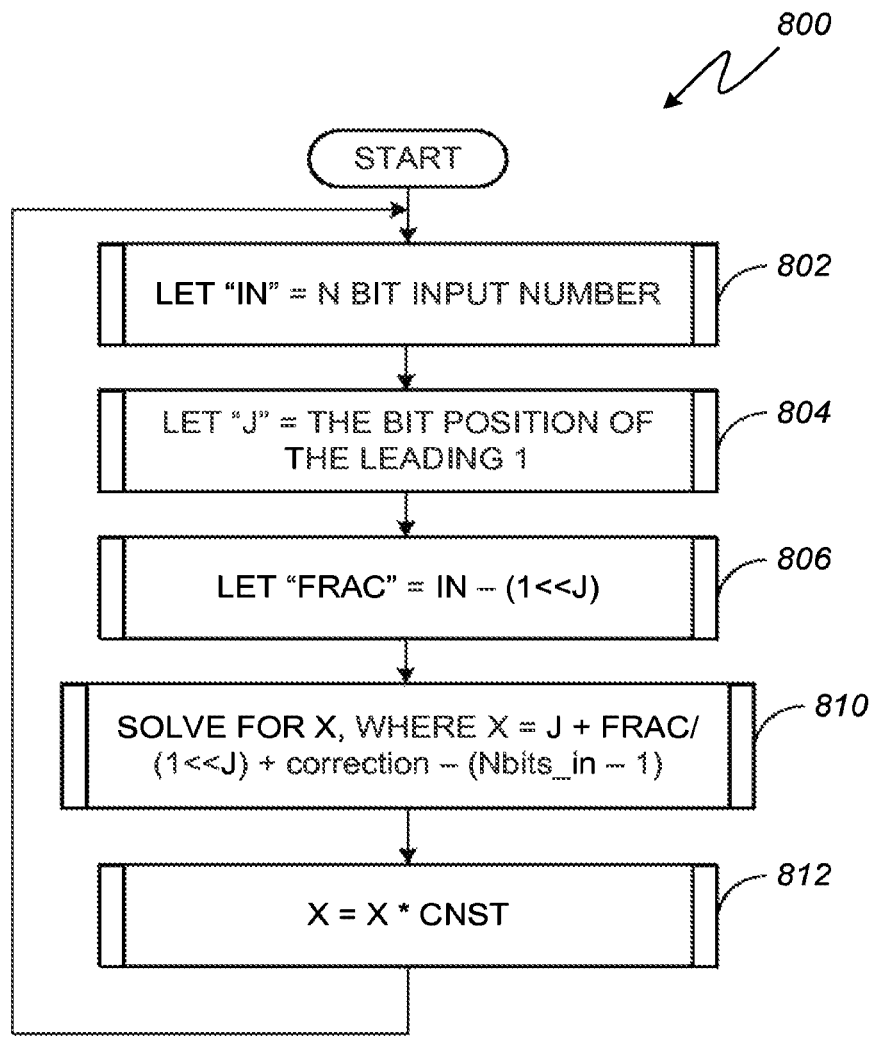
FIG. 8 is a flow chart illustrating an embodiment of a method for converting a voltage to a value in decibels.

FIG. 8 is a flow chart illustrating an embodiment of a method for converting a voltage value or other unit of measure using a linear scale to a value in decibels. The flow chart is an embodiment of an implementation of a leading ones detector. An example of a leading ones detector was introduced by Khalid H. Abed, in an article titled, "CMOS VLSI Implementation of a Low Power Logarithmic Converter," published in IEEE Transaction on Computers, November 2003. The flow diagram of FIG. 8 shows the architecture, functionality, and operation of a possible implementation via a circuit or circuits, software, and or firmware associated with the converter 334. In this regard, each block represents a module, segment, or portion of code, which comprises one or more executable instructions for implementing the specified function(s). When the converter 334 is implemented via hardware, hardware and firmware, or a combination of hardware and software, one or more blocks in the flow diagram may represent an additional circuit or circuits. Alternatively, the described functions can be embodied in source code including human-readable statements written in a programming language or machine code that comprises instructions recognizable by a suitable execution system such as a processor in a computer system. The machine code may be converted from the source code, etc.

Method 800 begins with block 802 where the $N_{bit}$ input number is used to define a variable "IN." In block 804, the bit position of a leading one from the filtered receive signal is used to define an integer "J." Next, in block 806, a variable "FRAC" is defined as the difference between the variable "IN" and (1<<J). In block 810, an intermediate value "X" is defined as the ratio of the sum of J and FRAC over the sum of the expression (1<<J), a correction value, and $(-N_{bit\_IN}$ number-1). Thereafter, as indicated in block 812, the variable X is set to the product of the intermediate value of X and a constant value. In an example embodiment, the constant is $10 \times \log_{10}(2)$ or 3.0103. The method for converting a linear unit to decibels, as described in association with blocks 802 through 812, can be initiated and repeated as desired.

Figure 9:
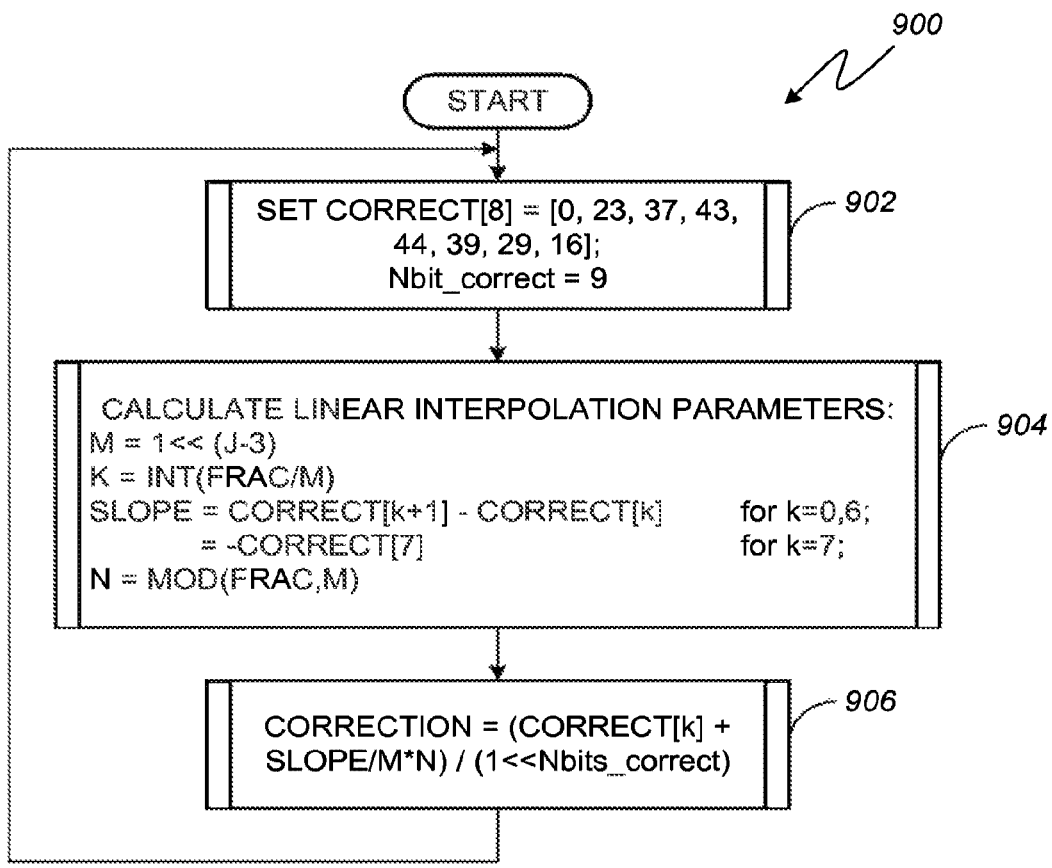
FIG. 9 is a flow chart illustrating an embodiment of a method for generating a correction factor for conversion from a linear unit of gain to decibels.

FIG. 9 is a flow chart illustrating an embodiment of a method for generating a correction factor for dB conversion. The correction algorithm allows for an error equivalent to the third lobe, i.e., N=3. For higher values of N, there are M-N points between every two points in the N=3 case. The algorithm in FIG. 9, interpolates for the in-between points. The flow diagram of FIG. 9 shows the architecture, functionality, and operation of a possible implementation via a circuit or circuits, software, and or firmware associated with the converter 334. In this regard, each block represents a module, segment, or portion of code, which comprises one or more executable instructions for implementing the specified function(s). When the converter 334 is implemented via hardware, hardware and firmware, or a combination of hardware and software, one or more blocks in the flow diagram may represent an additional circuit or circuits. Alternatively, the described functions can be embodied in source code including human-readable statements written in a programming language or machine code that comprises instructions recognizable by a suitable execution system such as a processor in a computer system. The machine code may be converted from the source code, etc.

Method 900 begins with block 902 where an array labeled "correct" and a variable Nbit_correct are defined. Specifically, the array correct includes 8 members. In the illustrated embodiment, the members are 0, 23, 37, 43, 44, 39, 29 and 16. The members represent quantized numbers for the following array [0, 0.0449, 0.0719, 0.084, 0.0849, 0.0754, 0.0573 and 0.0319]. In block 904, linear-interpolation parameters are calculated. Specifically, m=1 (j-N); k=int(frac/m); slope=correct[k+1]−correct[k] for k=0,6 and slope=−correct[7] for k=7; and n=mod(frac,m). In block 906, the correction factor is calculated using Equation 4.

$$\text{Correction}=(\text{correct}[k]+\text{slope}/m*n)/(1<<N\text{bits\_correct}) \qquad \text{Equation 4}$$

In FIG. 9, the parameter, slope, determines in which segment of the correct[8] vector, the point falls. Parameter, m, determines how many points in between every two points in the correct[8] vector exist. Among the m points, parameter, n, determines the position of the value to be calculated. The method for generating a correction factor for dB conversion, as described in association with blocks 902 through 906, can be initiated and repeated as desired.

To calculate the digital scale factor, an anti-log function with sufficient accuracy (about 0.15 dB) over the desired digital-dynamic range of the digital control branch 360, i.e., approximately 72 dB is provided. The anti-log algorithm is a variant of the leading one detector method that operates in base two. As a result, the digital gain in dB is multiplied by a constant L2DB=$((\log_2(10))/20)$ or 0.166096 prior to conversion as shown in Equation 5.

$$x_{lm}=2^{2L2DB \cdot xdB}=2^m \cdot 2^{frac} \cong 2^m(1+\text{frac}) \qquad \text{Equation 5}$$

Figure 10:
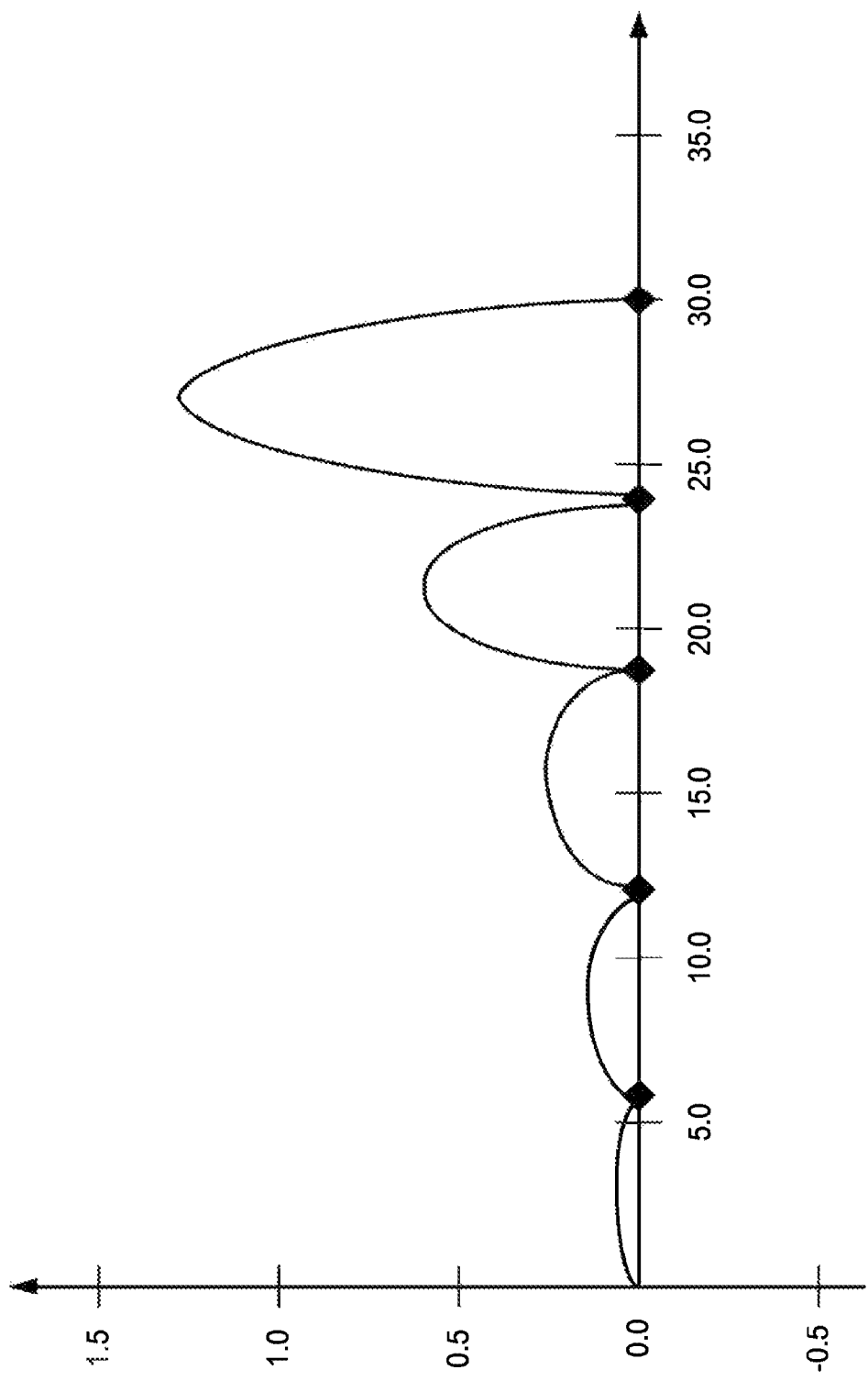
FIG. 10 is a chart illustrating uncorrected error due to power-of-two conversions.

In the above equation, m is an integer and frac is a number smaller than 1. The error in the above approximation grows exponentially over each segment or integer power of two as shown in the plot of FIG. 10. If a reference error is deemed acceptable, a correction can be applied to adjust for the error. Table 3 below illustrates values used in a $2^{frac}$ approximation when m=0.

TABLE 3

REFERENCE VALUES FOR POWER OF 2 CONVERSION

| X (dB) | Frac(i) = x * L2DB | C(i) = $2^{(X * L2DB)}$ |
|---|---|---|
| 0 | 0 | |
| 1 | 42 | 1149 |
| 2 | 84 | 1289 |
| 3 | 126 | 1446 |
| 4 | 168 | 1623 |
| 5 | 210 | 1821 |
| 6 | 252 | 2043 |

The approximation used if m is not equal to zero is:

$$x_{lin} = 2^m \cdot (C(i) - m \cdot \text{slope}), \quad \text{Equation 6}$$

where slope is a fixed value equal to 0.003422. Frac(i) is the fractional part and C(i) is the final output when m=0. When m is not equal to zero, the routine described in association with FIG. 11 searches for the appropriate region in frac(i) space to determine i. The routine then uses C(i) to compute the final value.

Figure 11:
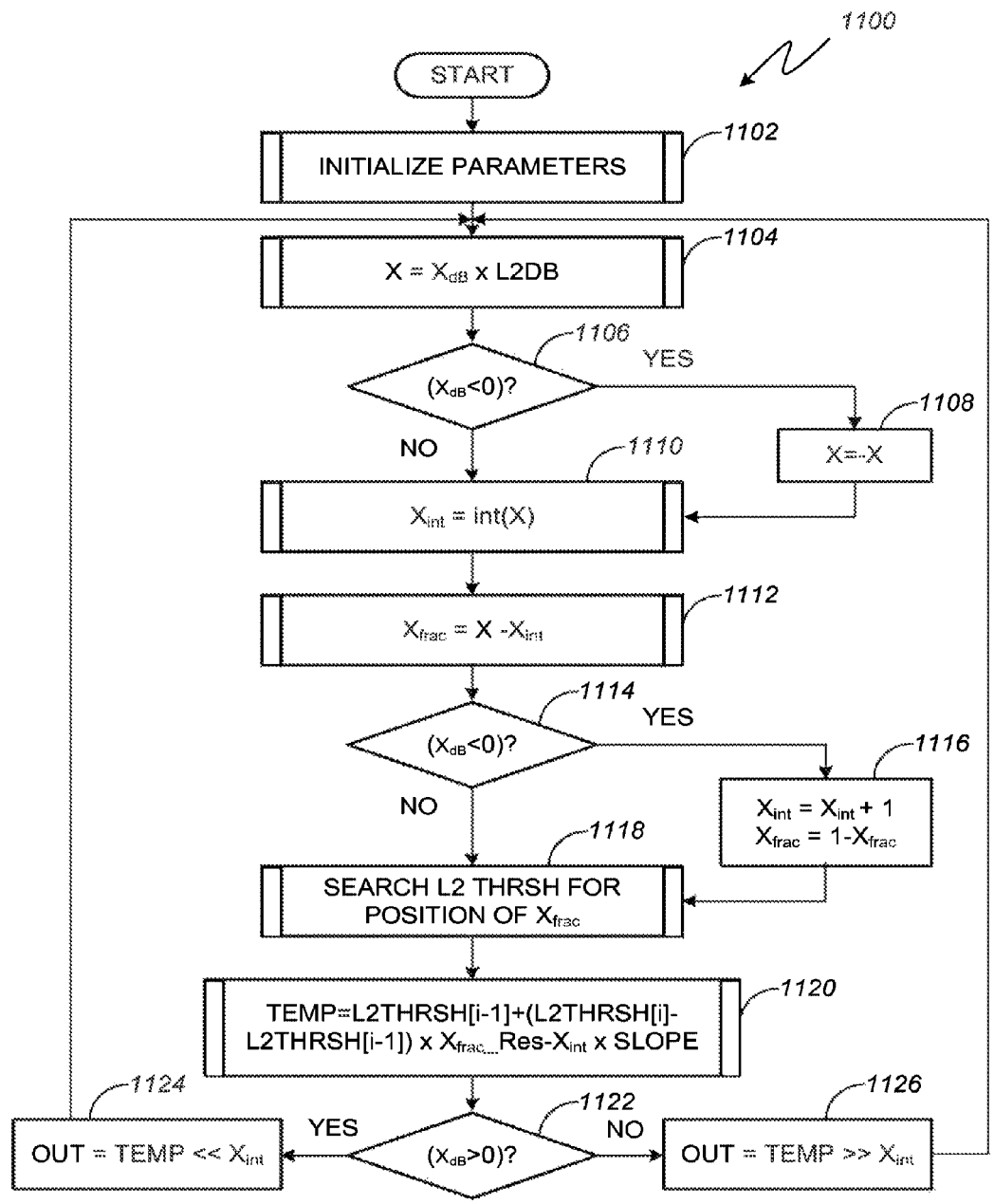
FIG. 11 is a flow chart illustrating an embodiment of a method for generating a correction factor for conversion from decibels to a linear unit of gain.

FIG. 11 is a flow chart illustrating an embodiment of a method for generating a correction factor for conversion from decibels to a linear unit of gain. The flow diagram of FIG. 11 shows the architecture, functionality, and operation of a possible implementation via a circuit or circuits, software, and or firmware associated with the converter 364. In this regard, each block represents a module, segment, or portion of code, which comprises one or more executable instructions for implementing the specified function(s). When the converter 364 is implemented via hardware, hardware and firmware, or a combination of hardware and software, one or more blocks in the flow diagram may represent an additional circuit or circuits. Alternatively, the described functions can be embodied in source code including human-readable statements written in a programming language or machine code that comprises instructions recognizable by a suitable execution system such as a processor in a computer system. The machine code may be converted from the source code, etc.

Method 1100 begins with block 1102 where parameters L2DB and slope are initialized and arrays L2frac and L2Thrsh are populated. In an example embodiment, L2DB is set to 42 and slope is set to 4. In addition, the L2frac array is populated with members 1149, 1289, 1446, 1623, 1821 and 2043 and the L2Thrsh array is populated with members 42, 84, 126, 168, 210 and 252. The members of these arrays may be quantized to a desired precision. Thereafter, as indicated in block 1104, the variable X is set to the product of X (in decibels) and L2DB. In block 1110 the variable $X_{int}$ is set to int(X). In block 1112, $X_{frac}$ is set to the difference of X and $X_{int}$. Thereafter, the variable TEMP is determined by the product of X and the slope and the variable TEMP1 is determined by the sum of $X_{frac}$ and TEMP. The L2 Array is searched to determine the position of TEMP1. An output value is set as a function of TEMP, and the position determined. The method for generating a correction factor for conversion from decibels to a linear unit of gain, as described in association with blocks 1102 through 1126, can be initiated and repeated as desired.

While various embodiments of the circuits and methods for managing analog gain control in quadrature signal paths of a receiver have been described, it will be apparent to those of ordinary skill in the art that many more embodiments and implementations are possible that are within the scope of this disclosure. Accordingly, the circuit and methods are not to be restricted except in light of the attached claims and their equivalents.

What is claimed is:

1. An automatic gain control (AGC) circuit comprising:
   an analog control branch including a first feedback adder and a lookup table, the analog control branch responsive to a gain value from a baseband system and a first calibration value, the analog control branch configured to generate an analog control signal;
   a digital control branch including a programmable delay element and a second feedback adder, the programmable delay element configured to create a delayed analog control signal from the analog control signal, the second feedback adder configured to calculate a digital control signal based on the gain value from the baseband system, the delayed analog control signal, and a second calibration value; and
   a switching element configured to controllably provide the gain value from the baseband system to the analog control branch and the digital control branch.

2. The circuit of claim 1 wherein the first calibration value is a programmable value.

3. The circuit of claim 1 wherein the first feedback adder is configured to calculate a Receive Signal Strength Indicator (RSSI) based on the gain value from the baseband system and the first calibration value.

4. The circuit of claim 3 wherein the analog control signal is based on the RSSI and the lookup table.

5. The circuit of claim 1 wherein the first calibration value is selected to compensate for a variation in a receive signal strength based at least in part on one or more of temperature and signal frequency.

6. The circuit of claim 1 wherein the analog control branch is further configured to provide the analog control signal to an analog receiver path, the analog control signal indicating an amplification to be applied to constituent parts of a receive signal.

7. The circuit of claim 1 wherein the digital control branch further includes a converter configured to generate a control word based on the digital control signal.

8. The circuit of claim 7 wherein the digital control signal is a logarithmic signal and the converter is further configured to convert the digital control signal to a linear value.

9. The circuit of claim 7 wherein the digital control branch is further configured to provide the control word to a scaler that applies a digital gain to an output of a digital receiver path.

10. A receiver comprising:
    an analog receiver path configured to receive a Radio Frequency (RF) signal and to amplify components of the RF signal;
    a digital receiver path configured to process the amplified components of the RF signal to obtain a processed signal;
    a scaler including a digital gain element configured to modify the processed signal to obtain a modified processed signal and to provide the modified processed signal to a baseband system; and
    an automatic gain control circuit including an analog control branch, a digital control branch, and a switching element, the analog control branch including a first feedback adder and a lookup table, the analog control branch configured to access a gain value and a first calibration value, the analog control branch configured to generate an analog control signal, the digital control branch including a programmable delay element and a second feedback adder, the programmable delay element configured to create a delayed analog control signal from the analog control signal, the second feedback adder configured to calculate a digital control signal based on the gain value, the delayed analog control signal, and a second calibration value, and the switching element configured to controllably provide the gain value to the analog control branch and the digital control branch.

11. The receiver of claim 10 wherein the first feedback adder is configured to calculate a Receive Signal Strength Indicator (RSSI) based on the gain value and the first calibration value.

12. The receiver of claim 11 wherein the analog control signal is based on the RSSI and the lookup table.

13. The receiver of claim 10 wherein the first calibration value is selected to compensate for a variation in a receive signal strength based at least in part on one or more of temperature and a signal frequency of the RF signal.

14. The receiver of claim 10 wherein the analog control branch is further configured to provide the analog control signal to the analog receiver path and wherein the analog receiver path is further configured to amplify the components of the RF signal based on the analog control signal.

15. The receiver of claim 10 wherein the digital control signal is a logarithmic signal and the digital control branch further includes a converter configured to convert the digital control signal to a linear value and to generate a control word based on the digital control signal.

16. The receiver of claim 15 wherein the digital control branch is further configured to provide the control word to the scaler and wherein the digital gain element of the scaler is configured to modify the processed signal based on the control word.

17. The receiver of claim 10 wherein the RF signal includes an in-phase (I) signal component and a quadrature phase (Q) signal component and wherein the analog receiver path is further configured to amplify the the I signal component and the Q signal component of the RF signal.

18. The receiver of claim 10 wherein the digital receiver path includes one or more signal processing elements configured to compensate for power variation of frequencies of the amplified components of the RF signal.

19. The receiver of claim 10 wherein the digital receiver path includes a channel select filter configured to remove frequencies of the amplified components of the RF signal.

20. A wireless device comprising:

a baseband system; and a receiver including an analog receiver path, a digital receiver path, a scaler, and an automatic gain control circuit, the analog receiver path configured to receive a Radio Frequency (RF) signal and to amplify components of the RF signal, the digital receiver path configured to process the amplified components of the RF signal to obtain a processed signal, the scaler including a digital gain element configured to modify the processed signal to obtain a modified processed signal and to provide the modified processed signal to the baseband system, and the automatic gain control circuit including an analog control branch and a digital control branch, the analog control branch including a first feedback adder, the analog control branch configured to access a gain value, the analog control branch configured to generate an analog control signal, the digital control branch including a programmable delay element and a second feedback adder, the programmable delay element configured to create a delayed analog control signal from the analog control signal, and the second feedback adder configured to calculate a digital control signal based at least in part on the gain value and the delayed analog control signal.

* * * * *